US010037999B2

(12) United States Patent
Kim et al.

(10) Patent No.: US 10,037,999 B2
(45) Date of Patent: Jul. 31, 2018

(54) SEMICONDUCTOR DEVICE INCLUDING LANDING PAD FOR CONNECTING SUBSTRATE AND CAPACITOR

(71) Applicant: Samsung Electronics Co., Ltd., Suwon-Si, Gyeonggi-Do (KR)

(72) Inventors: Dae-ik Kim, Hwaseong-si (KR); Hyoung-sub Kim, Seongnam-si (KR); Sung-eui Kim, Suwon-si (KR); Hoon Jeong, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 115 days.

(21) Appl. No.: 14/591,732

(22) Filed: Jan. 7, 2015

(65) Prior Publication Data

US 2015/0214146 A1    Jul. 30, 2015

(30) Foreign Application Priority Data

Jan. 24, 2014   (KR) ........................ 10-2014-0009166

(51) Int. Cl.
| | |
|---|---|
| *H01L 23/48* | (2006.01) |
| *H01L 23/52* | (2006.01) |
| *H01L 29/40* | (2006.01) |
| *H01L 27/108* | (2006.01) |

(52) U.S. Cl.
CPC .. *H01L 27/10885* (2013.01); *H01L 27/10855* (2013.01); *H01L 2924/0002* (2013.01)

(58) Field of Classification Search
CPC ......... H01L 27/10885; H01L 27/10855; H01L 2924/0002; H01L 27/10814; H01L 21/76847; H01L 29/4236; H01L 27/10823; H01L 27/0207; H01L 21/3212
USPC ........ 257/741, 296, 306, 330, 637, 499, 770
See application file for complete search history.

(56) References Cited

U.S. PATENT DOCUMENTS

| | | | |
|---|---|---|---|
| 2011/0073940 A1* | 3/2011 | Lee ................... | H01L 21/28518 257/332 |
| 2012/0132971 A1 | 5/2012 | Mikasa | |
| 2012/0193696 A1 | 8/2012 | Fukushima | |
| 2012/0211813 A1 | 8/2012 | Taketani | |
| 2012/0228702 A1 | 9/2012 | Wu | |
| 2012/0248519 A1 | 10/2012 | Shinhara | |
| 2012/0273859 A1 | 11/2012 | Oyu et al. | |
| 2012/0281490 A1* | 11/2012 | Cho .................. | H01L 27/10876 365/205 |
| 2012/0305999 A1 | 12/2012 | Okonogi | |

(Continued)

FOREIGN PATENT DOCUMENTS

JP        2012019035 A        1/2012

*Primary Examiner* — Kimberly Rizkallah
*Assistant Examiner* — Dilinh Nguyen
(74) *Attorney, Agent, or Firm* — Harness, Dickey & Pierce, P.L.C.

(57) ABSTRACT

A semiconductor device includes a substrate including an active region, a plurality of conductive line structures separate from the substrate, a plurality of contact plugs between the plurality of conductive line structures, a plurality of landing pads connected to a corresponding contact plug of the plurality of contact plugs, a landing pad insulation pattern between the plurality of landing pads, and a first insulation spacer between the landing pad insulation pattern and first conductive line structures from among the plurality of conductive line structures.

19 Claims, 17 Drawing Sheets

(56) References Cited

U.S. PATENT DOCUMENTS

| | | |
|---|---|---|
| 2013/0034957 A1 | 2/2013 | Miyata |
| 2013/0087880 A1 | 4/2013 | Hall et al. |
| 2013/0093093 A1 | 4/2013 | Lee |
| 2013/0107630 A1* | 5/2013 | Fisch ................ H01L 21/28273 365/185.18 |
| 2014/0175659 A1* | 6/2014 | Lee ...................... H01L 21/764 257/773 |

* cited by examiner

SEMICONDUCTOR DEVICE INCLUDING LANDING PAD FOR CONNECTING SUBSTRATE AND CAPACITOR

CROSS-REFERENCE TO RELATED APPLICATIONS

This application claims the benefit of Korean Patent Application No. 10-2014-0009166, filed on Jan. 24, 2014, in the Korean Intellectual Property Office, the disclosure of which is incorporated herein in its entirety by reference.

BACKGROUND

1. Field

Example embodiments of the inventive concepts relate to a semiconductor device, and more particularly, to a semiconductor device including a landing pad for connecting an active region of a substrate and a lower electrode of a capacitor.

2. Description of the Related Art

As a degree of integration of a semiconductor device increases, a design rule for elements of the semiconductor device is reduced. In highly-scaled semiconductor devices, cross-sectional areas of a plurality of wiring lines and a cross-sectional area of a contact plug therebetween are being gradually reduced. Therefore, when connecting a capacitor lower electrode (which is formed on the contact plug having a reduced cross-sectional area) to an active region of a substrate through the contact plug, a bridge phenomenon of a landing pad (which connects the contact plug and the capacitor lower electrode) occurs.

SUMMARY

Example embodiments of the inventive concepts provide a semiconductor device that prevents or inhibits a neck phenomenon of a landing pad connected to a contact plug, in connecting a capacitor lower electrode and an active area of a substrate through the contact plug having a reduced cross-sectional area in the semiconductor device having a unit cell size which is micronized by integration.

According to example embodiments of the inventive concepts, a semiconductor device includes a substrate including an active region, a plurality of conductive line structures separate from the substrate, a plurality of contact plugs between the plurality of conductive line structures, a plurality of landing pads connected to a corresponding contact plug of the plurality of contact plugs, a landing pad insulation pattern between the plurality of landing pads, and a first insulation spacer between the landing pad insulation pattern and first conductive line structures from among the plurality of conductive line structures.

Second conductive line structures from among the plurality of conductive line structures may be formed to directly contact the landing pad insulation pattern. The plurality of landing pads may vertically overlap the plurality of conductive line structures such that the plurality of landing pads cover upper portions of the plurality of conductive line structures, and the plurality of landing pads may include first and second landing pads having widths of different sizes which cover an upper portion of a corresponding conductive line structure in a direction extending from a principal plane of the substrate.

The first insulation spacer may be included in an insulation spacer structure covering a side wall of each of the plurality of conductive line structures, and each of the plurality of contact plugs may be formed in a space limited by the insulation spacer structure between adjacent conductive line structures of the plurality of conductive line structures. The semiconductor device may further include a conductive barrier layer covering upper surfaces of the plurality of conductive line structures, an upper surface of each of the plurality of contact plugs, and a sidewall of the insulation spacer structure, and the conductive barrier layer may be covered by the plurality of landing pads. The insulation spacer structure may include an air spacer.

The insulation spacer structure may include the first insulation spacer and second and third insulation spacers sequentially formed from a side wall of a corresponding conductive line structure, and the second and third insulation spacers and the plurality of contact plugs may have an upper surface at a same level. The plurality of conductive line structures and the first insulation spacer may have an upper surface at a same level, and upper surfaces of the second and third insulation spacers and the plurality of contact plugs may be lower than upper surfaces of the plurality of conductive line structures and the first insulation spacer. The semiconductor device may further include a contact conductive layer contacting an upper surface of a corresponding contact plug. The first insulation spacer may be included in an insulation spacer structure covering a side wall of each of the plurality of conductive line structures, and the contact conductive layer may cover a portion of an upper surface of the insulation spacer structure. The plurality of contact plugs and the contact conductive layer may be formed of the same material. The contact conductive layer may be a silicon epitaxial layer.

According to example embodiments of the inventive concepts, a semiconductor device includes a substrate including an active region, a plurality of conductive line structures separate from the substrate, an insulation spacer structure covering a side wall of each of the plurality of conductive line structures, a contact plug in a space limited by the insulation spacer structure between adjacent conductive line structures of the plurality of conductive line structures, a conductive barrier layer covering upper surfaces of the plurality of conductive line structures, an upper surface of the contact plug, and a sidewall of the insulation spacer structure, a plurality of landing pads connected to the contact plug through the conductive barrier layer, a landing pad insulation pattern between the plurality of landing pads, the landing pad insulation pattern covering a portion of an upper surface of each of the plurality of conductive line structures and a portion of an upper surface of the insulation spacer structure, wherein the insulation spacer structure includes a first insulation spacer between the landing pad insulation pattern and the plurality of conductive line structures.

The insulation spacer structure may further include second and third insulation spacers, the plurality of conductive line structures and the first insulation spacer may have upper surfaces at a first level, the second and third insulation spacers may have upper surfaces at a second level, the contact plug may have an upper surface at a third level, the first level may be higher than the second and third levels, and the second level may be higher than the third level. The second insulation spacer may be an air spacer.

According to example embodiments of the inventive concepts, a semiconductor device includes a substrate including an active region, a plurality of conductive line structures separate from the substrate, an insulation spacer structure covering a side wall of each of the plurality of conductive line structures, the insulation spacer structure having a first portion with an upper surface higher than a second portion, a plurality of contact plugs between the plurality of conductive line structures, the plurality of contact plugs connected to the active region and having a first width, and a plurality of landing pads connected to a corresponding contact plug of the plurality of contact plugs, the plurality of landing pads including a lower region having a second width greater than the first width.

The plurality of landing pads may include an upper region having a third width less than the second width. The semiconductor device may further include a conductive barrier layer covering upper surfaces of the plurality of conductive line structures, an upper surface of each of the plurality of contact plugs, and a sidewall of the insulation spacer structure, and the conductive barrier layer may be covered by the plurality of landing pads. The second portion of the insulation spacer structure may include an air spacer, the second portion of the insulation spacer structure and the plurality of contact plugs may have an upper surface at a same level, and the first portion of the insulation spacer structure and the plurality of conductive line structures may have an upper surface at a same level. The semiconductor device may further include a contact conductive layer contacting an upper surface of a corresponding contact plug, and the plurality of contact plugs and the contact conductive layer may be formed of the same material.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
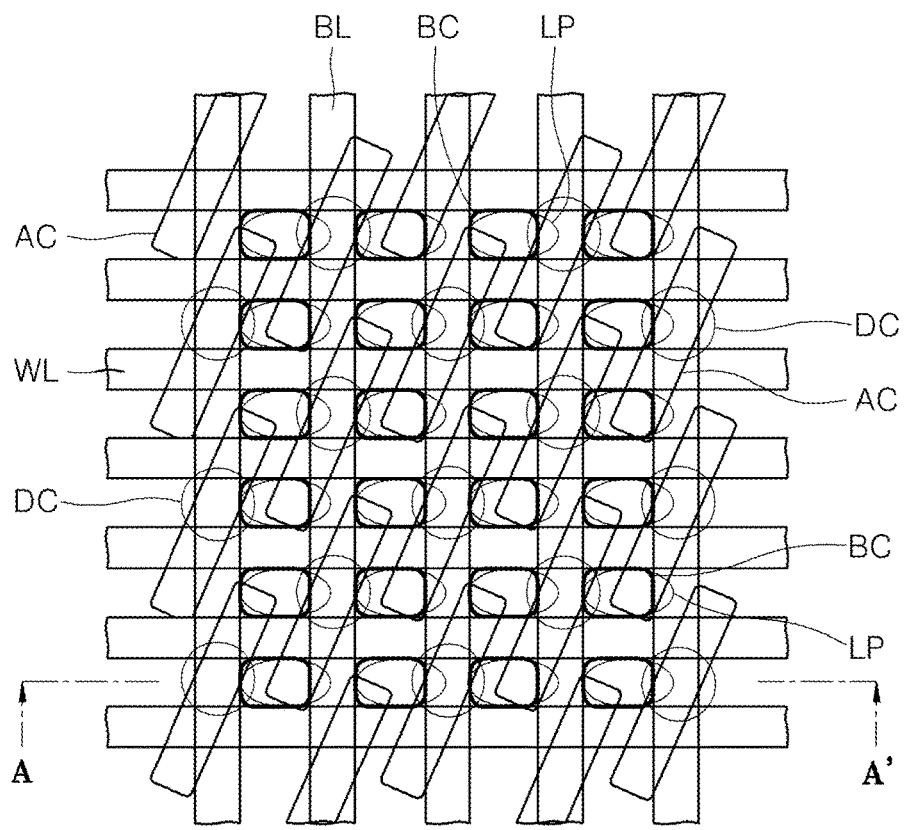
FIG. 1 is a schematic plan layout of a cell array region of a semiconductor device according to example embodiments of the inventive concepts.
Figure 1:
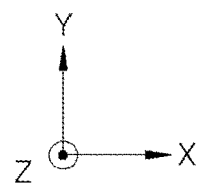

As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments of the inventive concepts will be described in detail with reference to the accompanying drawings. Like reference numerals in the drawings denote like elements, and thus their descriptions will not be repeated.

Example embodiments of the inventive concepts are provided for fully conveying the inventive concepts to those skilled in the art. The inventive concepts may be embodied in many different forms and should not be construed as being limited to the embodiments set forth herein; rather, these embodiments are provided so that this disclosure will be thorough and complete, and will fully convey the inventive concepts to those skilled in the art.

In the specification, though terms like a first and a second are used to describe various members, components, regions, layers, and/or portions in various example embodiments of the inventive concepts, the members, components, regions, layers, and/or portions are not limited to these terms. These terms do not denote a specific sequence, top and bottom, or merit and demerit, and are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment. For example, a first element may be referred to as a second element without departing from the spirit and scope of the inventive concepts, and similarly, the second element may also be referred to as the first element.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a specific embodiment may be differently implemented, a specific process sequence may be performed differently from a described sequence. For example, two processes which are successively described may be substantially performed, or may be performed in a sequence opposite to a described sequence.

In the accompanying drawings, for example, modifications of an illustrated shape may be expected according to manufacturing technology and/or a process difference. Therefore, example embodiments of the inventive concepts should not be construed as being limited to a specific shape of a region illustrated in the drawing, and for example, should include a shape change caused in a manufacturing process.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a schematic plan layout of a cell array region of a semiconductor device 10 according to example embodiments of the inventive concepts. The layout of FIG. 1, for example, may be applied to a memory cell having a unit cell size of 6 $F^2$ in a semiconductor memory device. Here, F denotes a minimum lithographic feature size.

Referring to FIG. 1, the semiconductor device 10 includes a plurality of active regions AC. A plurality of word lines WL extend in parallel across the plurality of active regions AC along a first direction (an X direction in FIG. 1). The plurality word lines may be arranged at equal intervals.

A plurality of bit lines BL are disposed on the plurality of word lines WL, and extend in parallel along a second direction (a Y direction in FIG. 1) crossing the first direction. The plurality of bit lines BL are connected to the plurality of active regions AC through a plurality of direct contacts DC.

In example embodiments, the plurality of bit lines BL may be arranged in parallel and to have a pitch of 3 F. In example embodiments, the plurality of word lines WL may be arranged in parallel and to have a pitch of 2 F.

A plurality of buried contacts BC may be configured as a contact structure that extends from a region between two adjacent bit lines BL of the plurality of bit lines BL to on one of the two adjacent bit lines BL. In example embodiments, the plurality of buried contacts BC may be arranged in one row along the first and second directions. In example embodiments, the plurality of buried contacts BC may be arranged at equal intervals along the second direction. A plurality of landing pads LP are formed to vertically overlap one bit line BL selected from among the plurality of bit lines BL.

Figure 2:
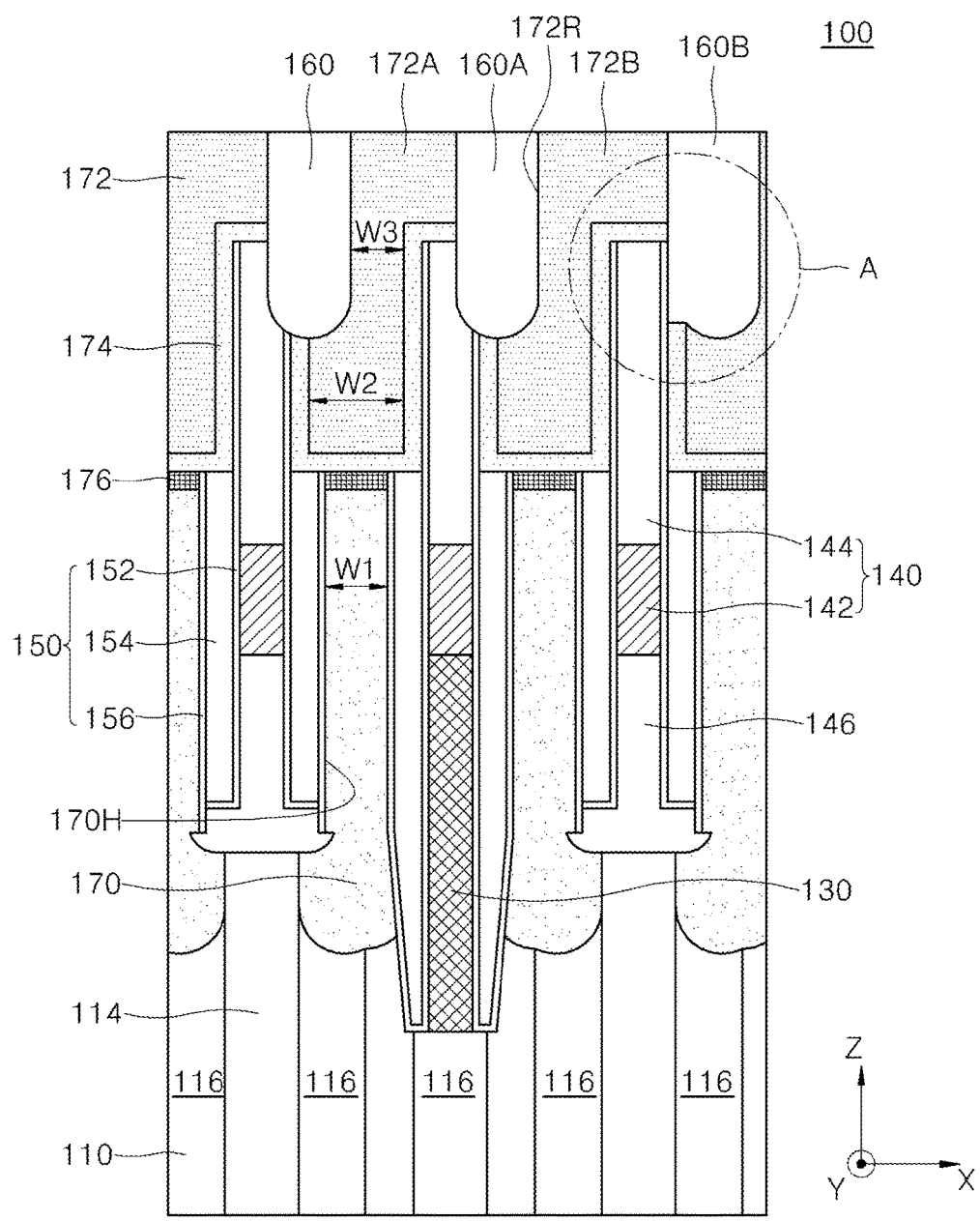
FIG. 2 is a main cross-sectional view of a semiconductor device according to example embodiments of the inventive concepts.

FIG. 2 is a main cross-sectional view of a semiconductor device 100 according to example embodiments of the inventive concepts. A cell array region of the semiconductor device 100 may have the layout of FIG. 1. FIG. 2 is a cross-sectional view of some elements corresponding to a cross-sectional surface of line A-A' of FIG. 1, and illustrates a main part showing a technical feature of example embodiments of the inventive concepts.

Referring to FIG. 2, the semiconductor device 100 includes a substrate 110 including an active region 116 that is defined by an isolation layer 114.

The substrate 110 may include silicon (Si), for example, single crystalline silicon, polycrystalline silicon, or amorphous silicon. In example embodiments, the substrate 110 may include a semiconductor material, e.g., germanium (Ge), silicon germanium (SiGe), silicon carbide (SiC), gallium arsenide (GaAs), indium arsenide (InAs), or indium phosphide (InP). In example embodiments, the substrate 110 may include a conductive region, for example, an impurity-doped well or an impurity-doped structure.

A plurality of conductive lines 142 are formed on the substrate 110 with an insulation layer 146 therebetween to be separated from the substrate 110. The plurality of conductive lines 142 may extend in parallel along one direction (the Y direction), on the substrate 110. The plurality of conductive lines 142 are illustrated as a single layer, but may be formed as a double, triple, or more multi-layer substructure without being limited thereto.

In example embodiments, the plurality of conductive lines 142 may configure a plurality of bit lines. Each of the plurality of conductive lines 142 may correspond to the bit line BL of FIG. 1.

An insulation capping line 144 is formed on each of the plurality of conductive lines 142. One conductive line 142 and one insulation capping line 144 covering the one conductive line 142 configure one conductive line structure 140.

Both side walls of each of a plurality of the conductive line structures 140 are covered by an insulation spacer structure 150. The insulation spacer structure 150 may include first to third insulation spacers 152, 154 and 156. The insulation spacer structure 150 is illustrated as a triple layer, but may have a single layer, a double layer, or a quadruple or more multilayer without being limited thereto. In example embodiments of the inventive concepts, the second insulation space 154 may be an air spacer.

A plurality of direct contacts 130, which are electrically and physically connected to the active region 116 of the substrate 110, are formed at respective bottoms of the plurality of conductive line structures 140. The plurality of direct contacts 130 may be electrically and physically connected to some of the plurality of conductive line structures 140. The plurality of direct contacts 130 may be formed deeper than the insulation layer 146, connected to some of the plurality of conductive line structures 140, in a direction (a direction opposite to a Z direction) facing the substrate 110. The plurality of direct contacts 130 may correspond to the direct contacts DC of FIG. 1.

A plurality of contact holes 170H may be formed to expose the active region 116 of the substrate 110. The contact hole 170H is limited by the insulation spacer structure 150, covering side walls of two adjacent conductive lines 142, between two adjacent conductive line structures 140 of the plurality of conductive line structures 140. The contact hole 170H may have a width of a first size W1 in a direction parallel to a principal plane extension direction of the substrate 110.

A plurality of contact plugs 170, which are connected to the substrate 110 and fill the inside of the contact hole 170H, are respectively formed between the plurality of conductive line structures 140. Each of the plurality of contact plugs 170 is connected to the active region 116 of the substrate 110, and extends in a direction (the Z direction) vertical to the principal plane extension direction of the substrate 110, in the contact hole 170H. A top level of the contact plug 170 may be formed lower than a top level of each of the plurality of conductive line structures 140.

A conductive barrier layer 174, which contacts a top of the contact plug 170 and tops of the second and third insulation spacers 154 and 156 of the insulation spacer structure 150 and covers a side of the first insulation spacer 152 and tops of the plurality of conductive line structures 140, is formed. The conductive barrier layer 174 limits a lower region of a landing pad 172, on the contact plug 170. In response to the contact hole 170H having the width of the first size W1, the lower region of the landing pad 172 may have a width of a second size W2 greater than the first size W1 in a direction parallel to the principal plane extension direction of the substrate 110.

A plurality of the landing pads 172 fill a space limited by the conductive barrier layer 174 in connection with the contact plug 170, and are formed to vertically overlap one conductive line structure 140 selected from among the plurality of conductive line structures 140. A landing pad recess region 172R, which limits respective spaces between the plurality of landing pads 172, is formed at upper certain portions of the plurality of conductive line structures 140 and a certain portion of each of the first insulation spacer 152 and conductive barrier layer 174. By forming the landing pad recess region 172R, the plurality of landing pads 172 may show an island-shaped plan view (see LP of FIG. 1). The landing pad 172 may correspond to the LP of FIG. 1.

A landing pad insulation pattern 160 filling the landing pad recess region 172R is formed. The landing pad insulation pattern 160 may separate the plurality of landing pads 172. The landing pad insulation pattern 160 may be formed of an insulating material, e.g., silicon oxide or silicon nitride.

A metal silicide layer 176 is formed between the contact plug 170 and the conductive barrier layer 174. The metal silicide layer 176 may fill a portion of a space of the contact hole 170H limited by a side wall of the insulation spacer structure 150, and may be formed to contact the contact plug 170. The metal silicide layer 176 may be formed of at least one selected from among cobalt silicide ($CoSi_x$), nickel silicide ($NiSi_x$), and manganese silicide ($MnSi_x$). In example embodiments of the inventive concepts, the metal silicide layer 176 may be formed of cobalt silicide ($CoSi_x$).

A top level of the metal silicide layer 176 may be formed as the same top level as that of each of the second and third insulation spacers 154 and 156. In example embodiments of the inventive concepts, the metal silicide layer 176 may not be formed. When the metal silicide layer 176 is not formed, the top level of each of the second and third insulation spacers 154 and 156 may be formed as the same top level as that of the contact plug 170.

The semiconductor device 100 according to example embodiments of the inventive concepts includes the contact plug 170 connected to the active region 116 of the substrate 170, for electrically connecting the active region 116 of the substrate 110 and the landing pad 172. The landing pad 172 is formed to vertically overlap the conductive line structure 140, on the conductive barrier layer 174. The contact plug 170 is formed in a space which is limited by the insulation spacer structure 150 and between two adjacent conductive line structures 140, and thus, a space may be secured by partially removing upper portions of the second and third insulation spacers 154 and 156 in the insulation spacer structure 150, for enlarging a cross-sectional area connected to the landing pad 172. Since a broader width is provided between the contact plug 170 and the landing pad 172, an upper region of the landing pad 172 may have a width of a third size W3 in a direction which extends in parallel from a principal plane of the substrate 110. Since the upper region of the landing pad 172 has the width of the third size W3, a neck phenomenon of the landing pad 172 is prevented or inhibited when the landing pad 172 is not normally formed in a manufacturing process or a resistance is changed.

The landing pad recess region 172R may be asymmetrically formed in a process of manufacturing the landing pad 172. That is, degrees to which an upper portion of the landing pad 172 covers the plurality of conductive line structures 140 differ, causing an overlap. A first landing pad 172A of the plurality of landing pads 172 is formed to cover only a portion of the insulation capping line 144 of the conductive line structure 140, but a second landing pad 172B is formed to cover an entirety of the insulation capping line 144. A first landing pad insulation pattern 160A directly connected to the first landing pad 172A is not directly connected to the insulation capping line 144 of the conductive line structure 140, but a second landing pad insulation pattern 160B directly connected to the second landing pad 172B is connected to the conductive line structure 140 with the first insulation spacer 152 therebetween. That is, degrees to which the plurality of landing pads 172 cover upper portions of the plurality of conductive line structures 140 may differ. As described above, when the landing pad recess region 172R which separates the landing pads 172 is asymmetrically formed, the landing pad insulation pattern 160 which fills the landing pad recess region 172R may be asymmetrically formed, and thus, the conductive barrier layer 174 is continuous without being broken, causing a bridge phenomenon of the landing pad 172. This will be additionally described with reference to FIG. 3.

Figure 3:
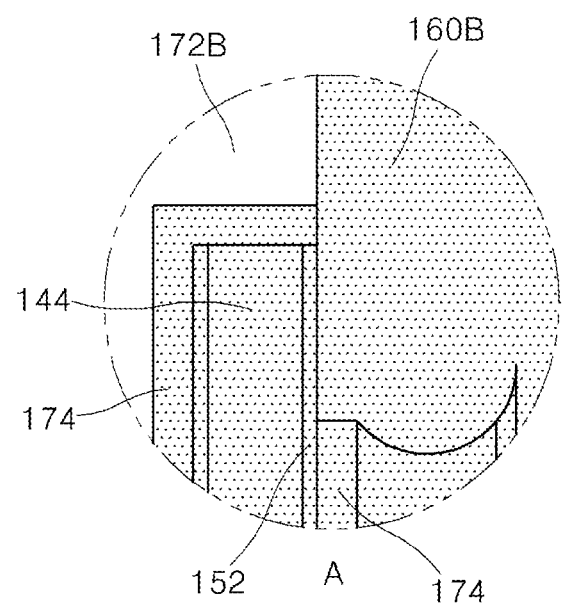
FIG. 3 is an enlarged view for describing a main part of a semiconductor device according to example embodiments of the inventive concepts.

FIG. 3 is an enlarged cross-sectional view for describing a region A illustrated as a dot line in FIG. 2. Referring to FIG. 3, the conductive barrier layer 174 is formed at a top of the insulation capping line 144 of the conductive line structure 140. A portion of the first insulation spacer 152 formed at a side wall of the conductive line structure 140 contacts the second landing pad insulation pattern 160B, and the other portion of the first insulation spacer 152 contacts the conductive barrier layer 174.

As described above with reference to FIG. 2, when the landing pad insulation pattern 160 which separates the landing pads 172 is asymmetrically formed, the conductive barrier layer 174 has a type which is continuously connected without being broken. A bridge phenomenon of the asymmetrically formed second landing pad 172B occurs in which the second landing pad 172B is short-circuited with the landing pad 172 without being separated from the landing pad 172. To prevent or inhibit the bridge phenomenon, the asymmetrically formed second landing pad insulation pattern 160B may have a type which is directly connected to the first insulation spacer 152. The conductive barrier layer 174 may not be formed at a portion of a side wall of the first insulation spacer 152.

Figure 4:
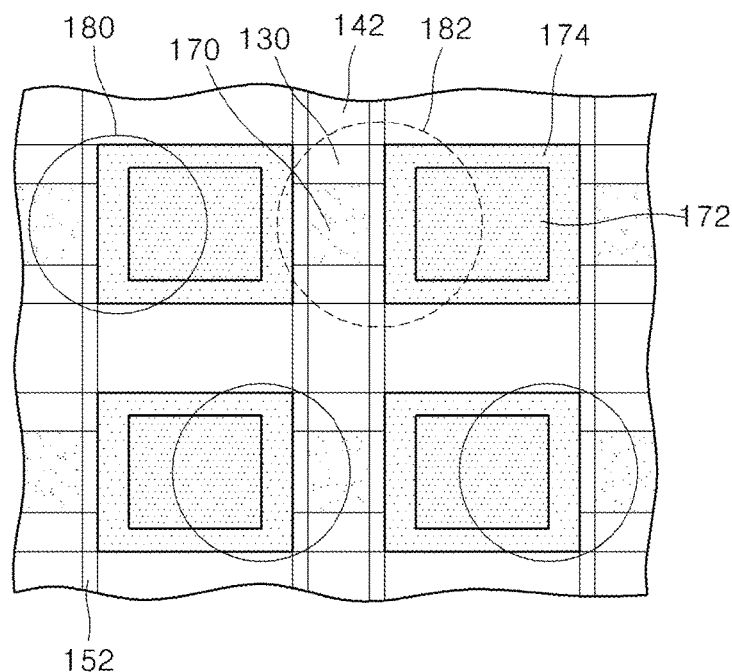
FIG. 4 is a plan view for describing a main part of a semiconductor device according to example embodiments of the inventive concepts.

FIG. 4 is a plan view illustrating a process of forming the landing pad 172 by using an etching mask 180.

Referring to FIG. 4, by using the etching mask 180 which is symmetrically disposed, a landing pad forming material layer 172F (see FIG. 10) is etched by a certain step height in all regions except a portion covered by the etching mask 180. A portion of each of the landing pad 172, conductive barrier layer 174, and first insulation spacer 152 may be covered by the etching mask 180, and thus maintained. Although the above-described etching process is performed, a scatter occurs in a process, and thus, a misalign region 182 illustrated as a dot line may be formed. As described above with reference to FIG. 3, the misalign region 182 covers a portion of the conductive barrier layer 174 formed at a top of the conductive line structure 140, in addition to a portion of the conductive barrier layer 174 which is maintained by using the etching mask 180, and disallows the covered portions of the conductive barrier layer 174 to be etched. For this reason, it is unable to separate the landing pads 172, causing the bridge phenomenon. A manufacturing method for preventing or inhibiting the bridge phenomenon will now be described in detail with reference to FIG. 5.

Figure 5:
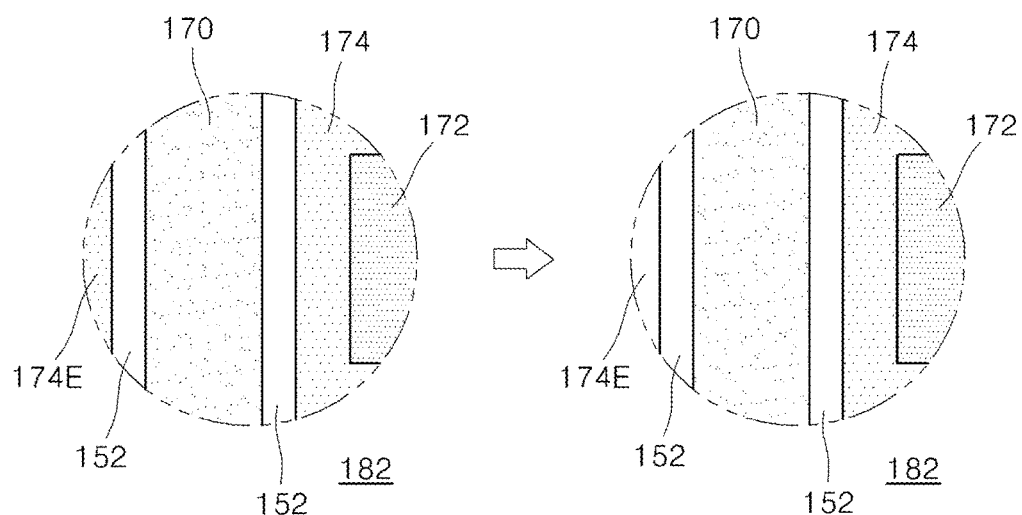
FIG. 5 is an enlarged view for describing a method of manufacturing a main part of a semiconductor device according to example embodiments of the inventive concepts.

FIG. 5 is a view for describing a manufacturing method for preventing or inhibiting the above-described bridge phenomenon of the landing pad 172, and is an enlarged view of the misalign region 182 of FIG. 5.

Referring to FIG. 5, in a region illustrated as a dot line, the conductive barrier layer 174 (which is formed to contact a region with the landing pad 172 formed therein) and a conductive barrier layer 174E which causes the bridge phenomenon are formed with the first insulation spacer 152 and contact plug 170 therebetween. When the conductive barrier layer 174E causing the bridge phenomenon is not removed, it is unable to separate the landing pads 172, causing a short circuit. Thus, the conductive barrier layer 174E may be removed. A wet etching method or a dry etching method may be used for removing the conductive barrier layer 174E causing the bridge phenomenon.

Figure 6:
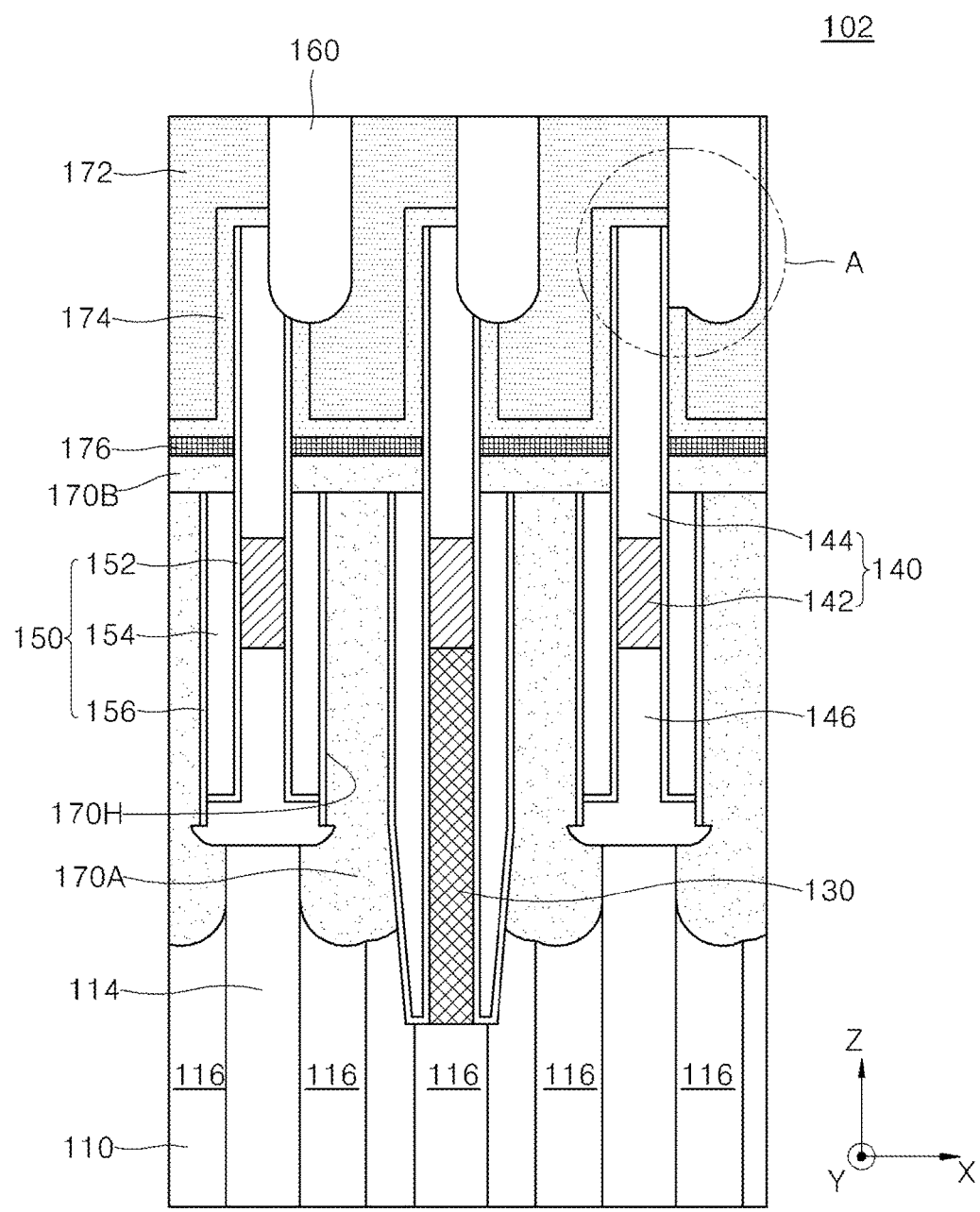
FIG. 6 is a main cross-sectional view of a semiconductor device according to example embodiments of the inventive concepts.

FIG. 6 is a main cross-sectional view of a semiconductor device 102 according to example embodiments of the inventive concepts. In FIG. 6, like reference numerals of FIG. 2 refer to like members. Herein, for conciseness of a description, detailed descriptions on repetitive elements are not repeated.

Referring to FIG. 6, in the semiconductor device 102, a contact plug 170A is formed in a space limited by an insulation spacer structure 150 which is formed at each of side walls of a pair of adjacent conductive line structures 140 among a plurality of conductive line structures 140, and a contact conductive layer 170B is formed at a top of the contact plug 170A. The contact conductive layer 170B may be formed at a top of a portion of the insulation spacer structure 150. In detail, the insulation spacer structure 150 may include first to third insulation spacers 152, 154 and 156 from the conductive line structure 140, and the contact conductive layer 170B may be formed to contact tops of the second and third insulation spacers 154 and 156.

Since the semiconductor device 102 described with reference to FIG. 6 includes the contact conductive layer 170B, conductivity with a landing pad 172 is enhanced, thereby enhancing a reliability of the semiconductor device 102. Except that the semiconductor device further includes the contact conductive layer 170B, the semiconductor device 102 has the same configuration as that of the semiconductor device 100 described above with reference to FIG. 2.

Figure 7:
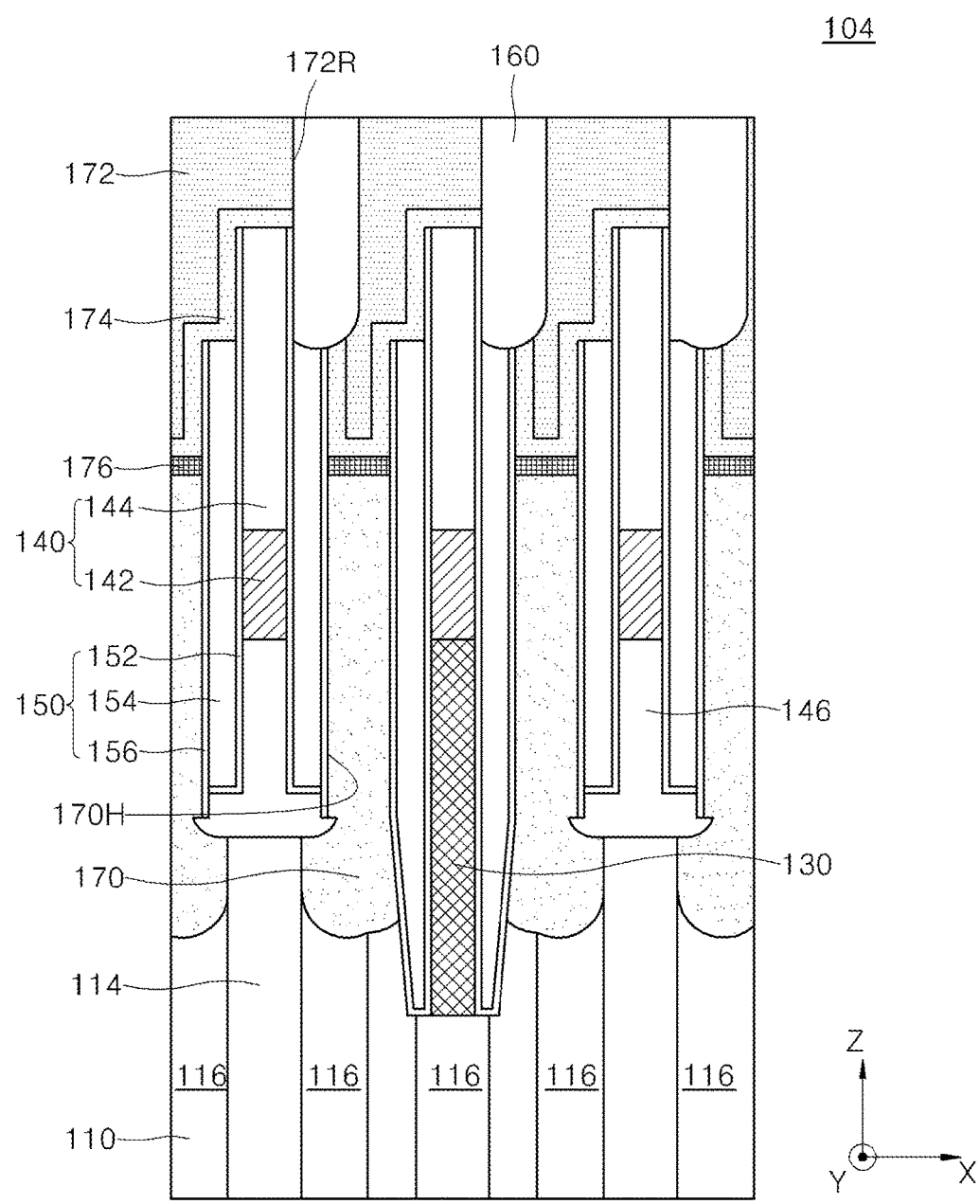
FIG. 7 is a main cross-sectional view of a semiconductor device according to example embodiments of the inventive concepts.

FIG. 7 is a main cross-sectional view of a semiconductor device 104 according to example embodiments of the inventive concepts. In FIG. 7, like reference numerals of FIG. 2 refer to like members. Herein, for conciseness of a description, detailed descriptions on repetitive elements are not repeated.

Referring to FIG. 7, the semiconductor device 104 includes a plurality of conductive line structures 140, an insulation spacer structure 150, and a contact plug 170. Top levels of the conductive line structures 140 and insulation spacer structure 150 differ from that of the contact plug 170. That is, the conductive line structures 140 and a first insulation spacer 152 are formed to have a first top level, second and third insulation spacers 154 and 156 are formed to have a second top level, and the contact plug 170 is formed to have a third top level. The first top level is higher than the second and third top levels, and the second top level is higher than the third top level. Since the first to third top levels are formed to have different heights, a step height occurs in each of the first to third top levels.

A conductive barrier layer 174 is formed at tops of the plurality of conductive line structures 140, a top and side of the first insulation spacer 152, a top of the second insulation spacer 154, a top and side of the third insulation spacer 156, and a top of the contact plug 170. The conductive barrier layer 174 may not contact a portion of the side of the first insulation spacer 152, and a landing pad insulation pattern 160 may directly contact a side wall of the first insulation spacer 156 and the tops of the second and third insulation spacers 154 and 156. The first insulation spacer 160 may be disposed between the landing pad insulation pattern 160 and the plurality of conductive line structures 140. As described above with reference to FIG. 2, when the conductive barrier layer 174 is formed between the plurality of conductive line structures 140 and the landing pad insulation pattern 160 which separates a plurality of landing pads 172, the bridge phenomenon occurs, and thus, the first insulation spacer 152 is disposed for preventing or inhibiting the bridge phenomenon.

Except that the conductive line structure 140, the insulation spacer structure 150, and the contact plug 170 have different top levels and a plurality of the landing pad insulation patterns 160 separating the landing pads 172 is formed with the plurality of conductive line structures 140 and the first insulation spacer 152 therebetween, the semiconductor device 104 has the same configuration as that of the semiconductor device 100 described above with reference to FIG. 2.

FIGS. 8 to 17 are cross-sectional views based on a process sequence for describing a method of manufacturing the semiconductor device 100 (102 and 104) according to example embodiments of the inventive concepts.

A cell array region of the semiconductor device 100 (102 and 104) illustrated in FIGS. 8 to 17 may have the layout of FIG. 1. FIGS. 3 to 17 are cross-sectional views illustrating respective stages of a process of manufacturing some elements corresponding to a cross-sectional surface taken along line A-A' of FIG. 1. In FIGS. 8 to 17, like reference numerals of FIG. 2 refer to like members. Herein, for conciseness of a description, detailed descriptions on repetitive elements are not repeated.

Figure 8:
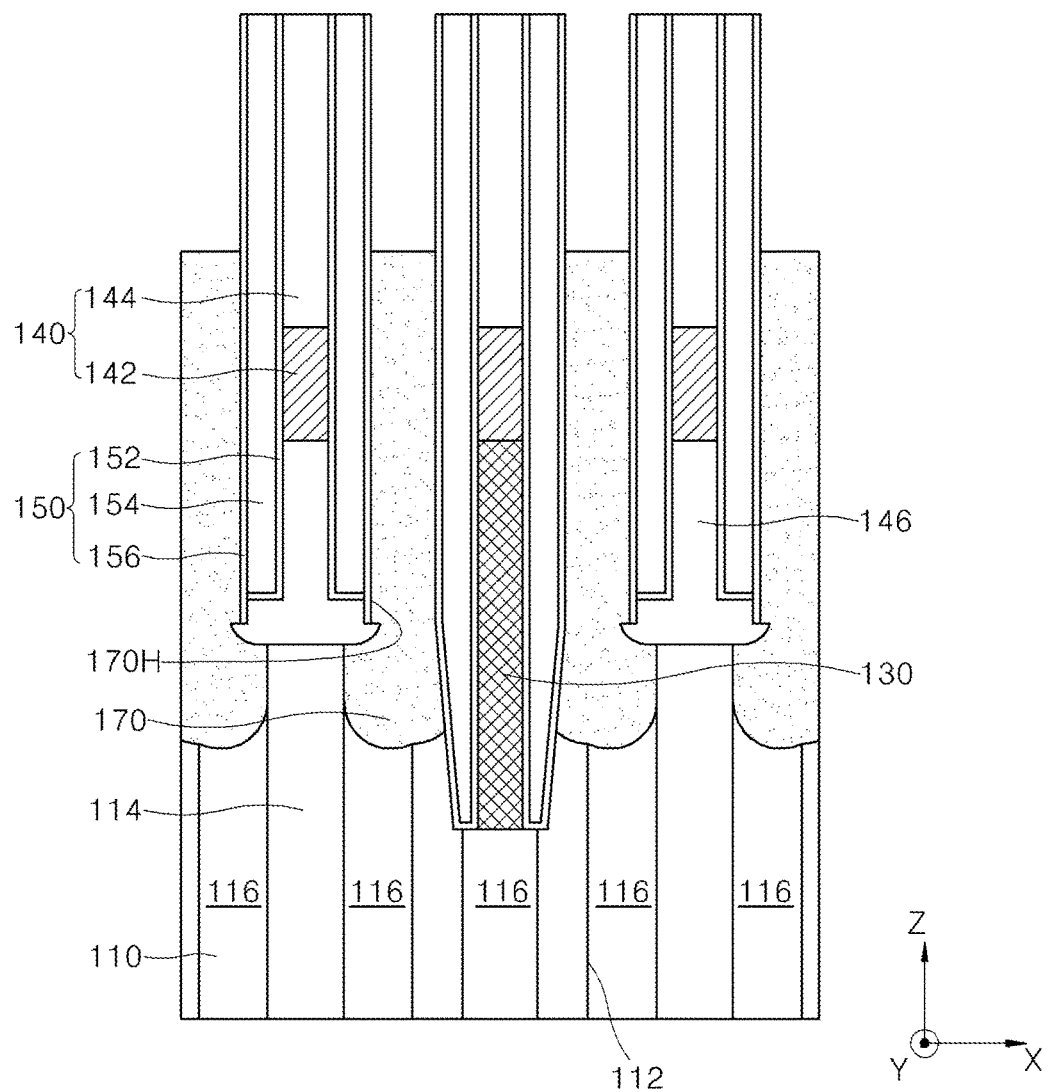
FIGS. 8 to 17 are cross-sectional views based on a process sequence for describing a method of manufacturing a semiconductor device according to example embodiments of the inventive concepts.

Referring to FIG. 8, an isolation trench 112 is formed on a substrate 110, and an isolation layer is formed in the isolation trench 112. A plurality of active regions 116 are defined on the substrate 110 by the isolation layer 114. The plurality of active regions 116 may have a relatively long island shape which has a short axis and a long axis as in the active region AC of FIG. 1.

The isolation layer 114 may be formed of a single layer, formed of one kind of insulation layer, or a multilayer formed by a combination of at least three kinds of insulation layers. The isolation layer 114 may be formed of at least one material selected from among silicon oxide, silicon nitride, or a combination thereof.

An insulation layer 146 is formed on the substrate 110. A plurality of conductive line structures 140, which extend in parallel, are formed on the insulation layer 146. The plurality of conductive line structures 140 include a plurality of conductive lines 142 and a plurality of insulation capping lines 144 which cover respective tops of the plurality of conductive lines 142. In example embodiments, the conductive line 142 may include at least one material selected from among poly silicon, impurity-doped semiconductor metal, conductive metal nitride, and metal silicide. In FIG. 8, the plurality of conductive lines 142 are illustrated as a single layer, but are not limited thereto. In example embodiments, the plurality of conductive lines 142 may be formed as a multilayer structure in which a metal silicide layer, a metal barrier layer, and an electrode layer formed of metal or metal nitride are sequentially stacked. For example, the plurality of conductive lines 142 may have a stack structure in which doped poly silicon, TiN, and tungsten are sequentially stacked.

In example embodiments, the plurality of insulation capping line 144 is formed of silicon nitride. A thickness of the plurality of insulation capping lines 144 may be greater than that of the plurality of conductive lines 142.

In example embodiments, a conductive line forming conductive layer and an insulation layer covering the conductive line forming conductive layer are first formed on the insulation layer 146, for forming the plurality of conductive line structures 140. A thickness of the insulation layer may be greater than that of the conductive line forming conductive layer. The plurality of insulation capping lines 144 may be formed by patterning the insulation layer, and then, the plurality of conductive lines 142 are formed by etching the conductive line forming conductive layer by using the plurality of insulation capping lines 144 as an etching mask.

A top and both side walls of each of the plurality of the conductive line structures 140 are covered by an insulation material, thereby forming an insulation spacer structure 150. First to third insulation spacers 152, 154 and 156 are formed from the conductive line structure 140. The insulation spacer structure 150 is illustrated as a triple layer, but may have a single layer structure, a double layer structure, or a quadruple or more multilayer structure without being limited thereto. The insulation spacer structure 150 may be formed of at least one material selected from among silicon oxide, silicon nitride, and a combination thereof.

Subsequently, a contact hole 170H is formed in a space limited by the insulation spacer structure 150 which is formed at each of side walls of a pair of adjacent conductive line structures 140 among the plurality of conductive line structures 140, and is filled with a contact forming conductive layer. A method of filling the contact forming conductive layer may use one selected from among a chemical vapor deposition method, a physical vapor deposition method, and a silicon epitaxial growing method. In example embodiments of the inventive concepts, the contact forming conductive layer may be formed of doped poly silicon. After the contact forming conductive layer is formed, a portion of the contact forming conductive layer is selectively removed by using an etching process having an etch selectivity, thereby forming a contact plug 170. In example embodiments of the inventive concepts, the contact forming conductive layer may be formed of poly silicon, and thus, a height may be lowered by selectively removing only the contact forming conductive layer in an etch back process or a dry etch method which uses a silane gas. A top level of the contact plug 170 may be formed lower than the plurality of conductive line structure 140 and the insulation spacer structure 150 in the above-descried process.

Figure 9:
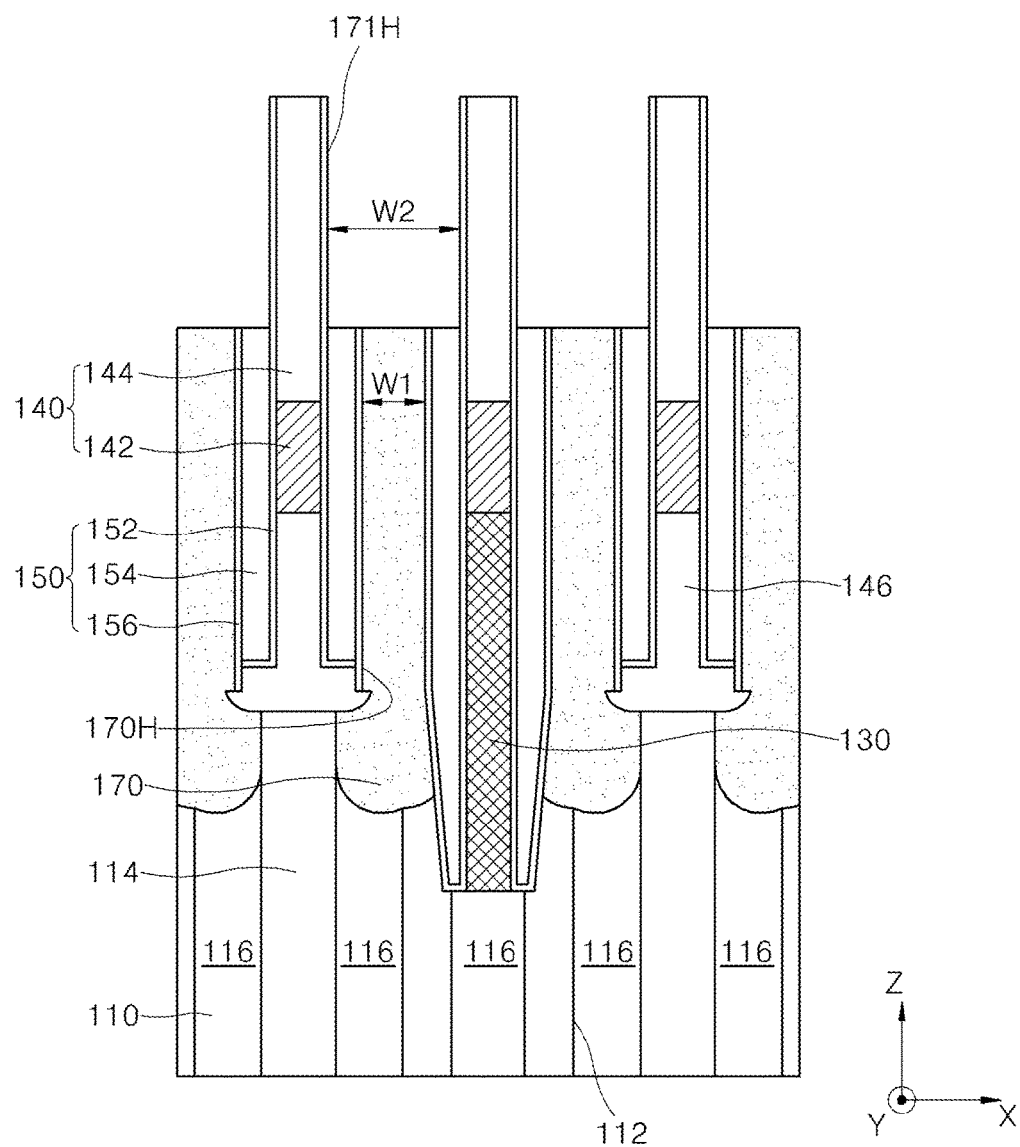

Referring to FIG. 9, a top level of the insulation spacer structure 150 is lowered by partially removing an upper portion of the insulation spacer structure 150, and thus becomes identical to the top level of the contact plug 170. In example embodiments of the inventive concepts, the insulation spacer structure 150 is formed of an insulating material, e.g., silicon oxide or silicon nitride, and thus, an upper certain portion of the insulation spacer structure 150 may be removed by using an etching method of selectively removing only the insulating material.

In example embodiments of the inventive concepts, the insulation spacer structure 150 may include first to third insulation spacers 152, 154 and 156, and only the second and third insulation spacers 154 and 156 are selectively removed by the above-described etching method. Top levels of the second and third insulation spacers 154 and 156 are formed identically to that of the contact plug 170. A second contact hole 171H may be formed by removing an upper certain portion of each of the second and third insulation spacers 154 and 156, namely, by removing the second and third insulation spacers 154 and 156 from a space of the contact hole 170H that is the space limited by the insulation spacer structure 150 in the pair of adjacent conductive line structures 140 among the plurality of conductive line structures 140. The contact hole 170H may have a width of a first size W1 in a direction which extends from a principal plane of the substrate 110, and the second contact hole 171H may have a width of a second size W2 in a direction which extends from the principal plane of the substrate 110. The width of the second size W2 may be greater than the width of the first size W1. Therefore, in a subsequent process, a neck phenomenon of a landing pad (see FIG. 11) is prevented or inhibited in forming the landing pad connected to the contact plug 170, thereby providing a semiconductor device having higher reliability.

Figure 10:
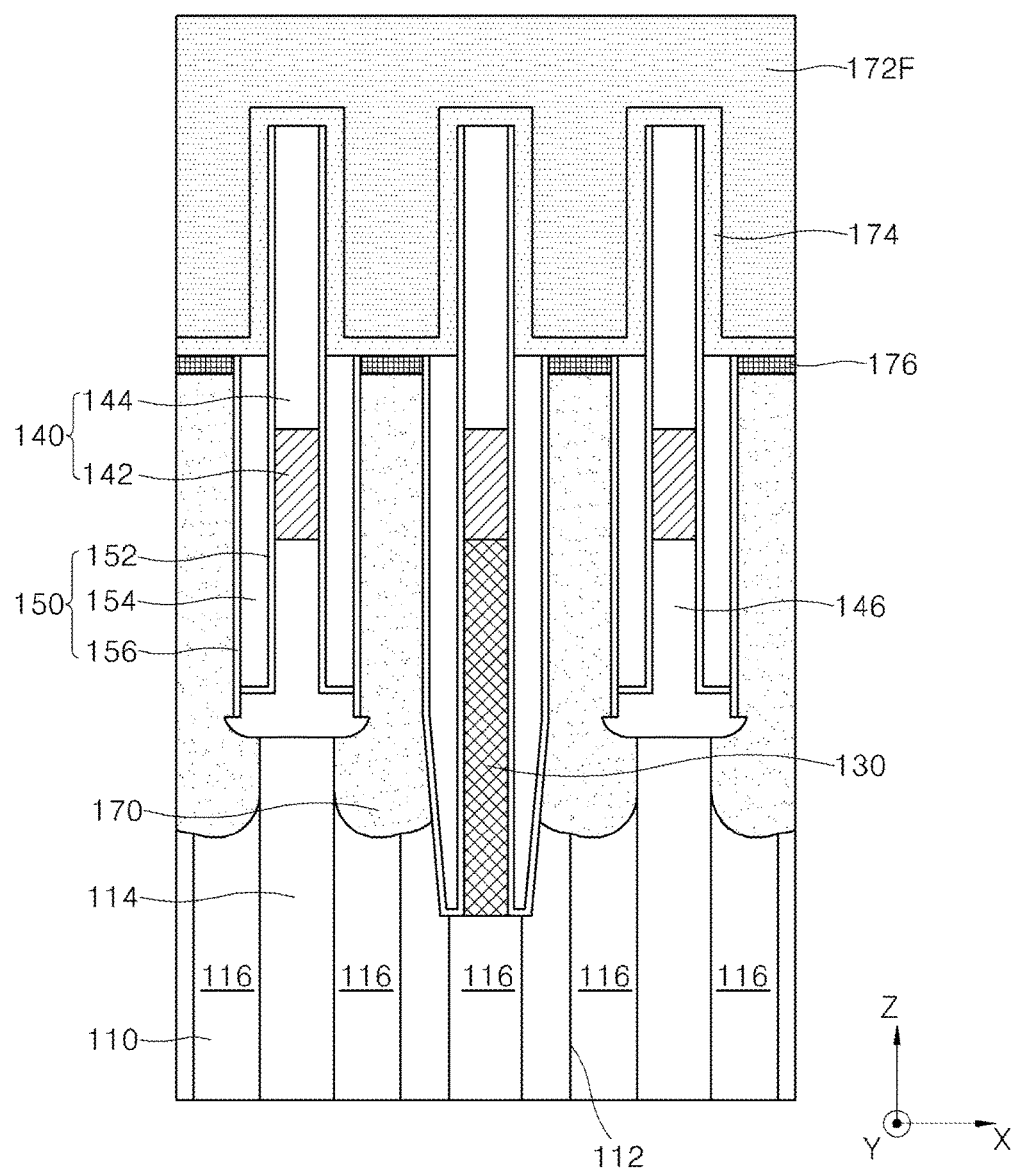

Referring to FIG. 10, a metal silicide layer 176 is formed on the contact plug 170, and a conductive barrier layer 174 which covers a top of the metal silicide layer 176, a side of the first insulation spacer 152, and tops of the second and third insulation spacers 154 and 156 is formed. Subsequently, a landing pad forming material layer 172F is formed.

The metal silicide layer 176 is formed at a surface in which a top of the contact plug 170 is exposed. The metal silicide layer 176 may be formed of at least one selected from among cobalt silicide ($CoSi_x$), nickel silicide ($NiSi_x$), and manganese silicide ($MnSi_x$). In example embodiments of the inventive concepts, the metal silicide layer 176 may be formed of cobalt silicide ($CoSi_x$). However, according to example embodiments of the inventive concepts, the metal silicide layer 176 is not limited thereto, and may be formed of a material selected from among various kinds of metal silicide. In example embodiments, the metal silicide layer 176 may not be formed.

In example embodiments of the inventive concepts, the following processes may be performed for forming the metal silicide layer 176. First, a metal layer is deposited on a surface which is exposed to a top of each of the plurality of contact lines 170, and then, the metal layer is silicidated by performing a first rapid thermal processing (RTP) process. The first RTP process may be performed under a temperature of about 450 degrees C. to about 550 degrees C. A metal layer which does not react with a silicon atom is removed in the first RTP process, and then, a second RTP process is performed under a temperature (for example, a temperature of about 800 degrees C. to about 950 degrees C.) higher than that of the first RTP process, thereby forming the metal silicide layer 176. Subsequently, a non-reaction portion of the metal layer is removed. In example embodiments, a cobalt (Co) metal layer may be formed as the metal layer, and thus, the metal silicide layer 176 formed of cobalt silicide may be provided.

After the metal silicide layer 176 is formed, the conductive barrier layer 174 which covers the top of the metal silicide layer 176, the side of the first insulation spacer 152, and the tops of the second and third insulation spacers 154 and 156 is formed, and the landing pad forming material layer 172F is formed on the conductive barrier layer 174.

The conductive barrier layer 174 may be formed of one material selected from among titanium (Ti), titanium nitride (TiN), and a stack structure thereof. In example embodiments of the inventive concepts, the conductive barrier 174 may be formed of TiN.

The landing pad forming material layer 172F may be formed by depositing at least one material selected from a metal material containing tungsten (W) and a conductive material containing doped poly silicon. The landing pad forming material layer 172F may be patterned in a subsequent process, and connected to the contact plug 170 through the conductive barrier layer 174.

Figure 11:
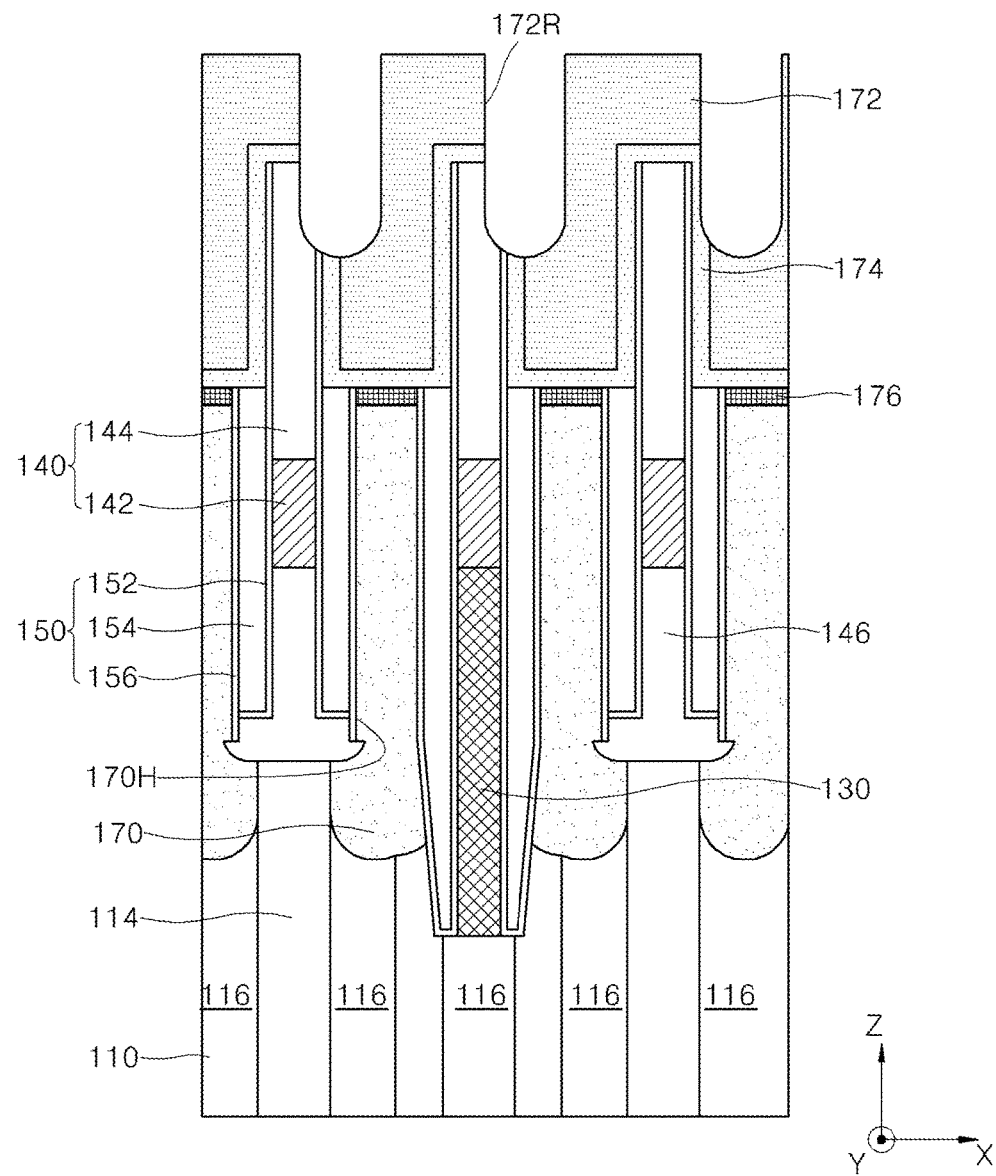

Referring to FIG. 11, in a cell array region, a landing pad recess region 172R which separates the plurality of landing pads 172 is formed by removing a portion of a top of the insulation capping line 144 of the plurality of conductive line structures 140 and a portion of a tope of each of the first insulation spacers 152 and conductive barrier layer 174 by using an etching mask 180 (see FIG. 4).

The etching mask 180 (see FIG. 4) may have a plurality of island-shaped mask patterns. When etching a plurality of exposed portions in the cell array region by the etching mask 180 (see FIG. 4), the landing pad recess region 172R may be formed in the cell array region, and a plurality of island-shaped landing pads 172 may remain from the landing pad forming material layer 172F. The plurality of landing pads 172 are connected to the contact plug 170, and is formed to vertically overlap one conductive line structure 140 selected from among the plurality of conductive line structures 140.

When performing the above-described etching process, the landing pad forming material layer 172F may be formed, and then, some of the plurality of conductive line structures 140 may remain without being removed. In particular, some of the plurality of insulation capping lines 144 of the plurality of conductive line structures 140 may remain as-is without being etched or removed. Also, the first insulation spacer 152 and the conductive barrier layer 144 which are formed at a side of the insulation capping line 144 may remain as-is without being removed. This is because a space in which the contact plug 170 is connected to the landing pad 172 is enlarged by removing a portion of the insulation spacer structure 150 as described above with reference to FIG. 9, and thus, a misalign region 182 (see FIG. 4) is formed. For this reason, the landing pad recess region 172R may be asymmetrically formed. The conductive barrier layer 174 may remain at a side of the first insulation spacer 152 without being removed, and thus, the bridge phenomenon of the landing pad 172 occurs in a subsequent process.

Figure 12:
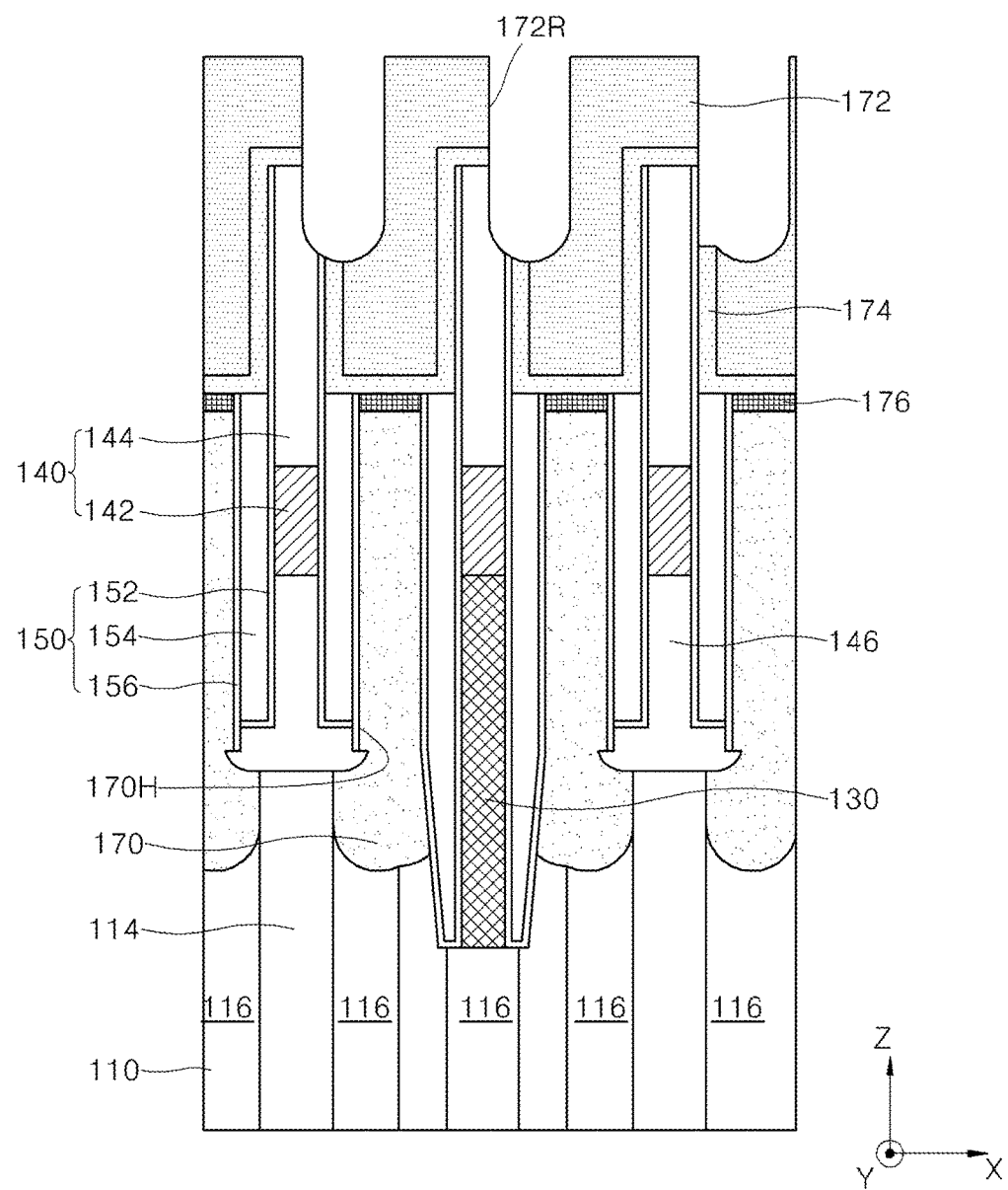

Referring to FIG. 12, a process of removing the remaining conductive barrier layer 174 is additionally performed.

The remaining conductive barrier layer 174 may be etched by using the wet etching method or the dry etching method which selectively removes only a conductive material. By additionally performing the process of removing the remaining conductive barrier layer 174, the bridge phenomenon is prevented or inhibited in which the plurality of landing pads 172 are short-circuited without being separated.

Figure 13:
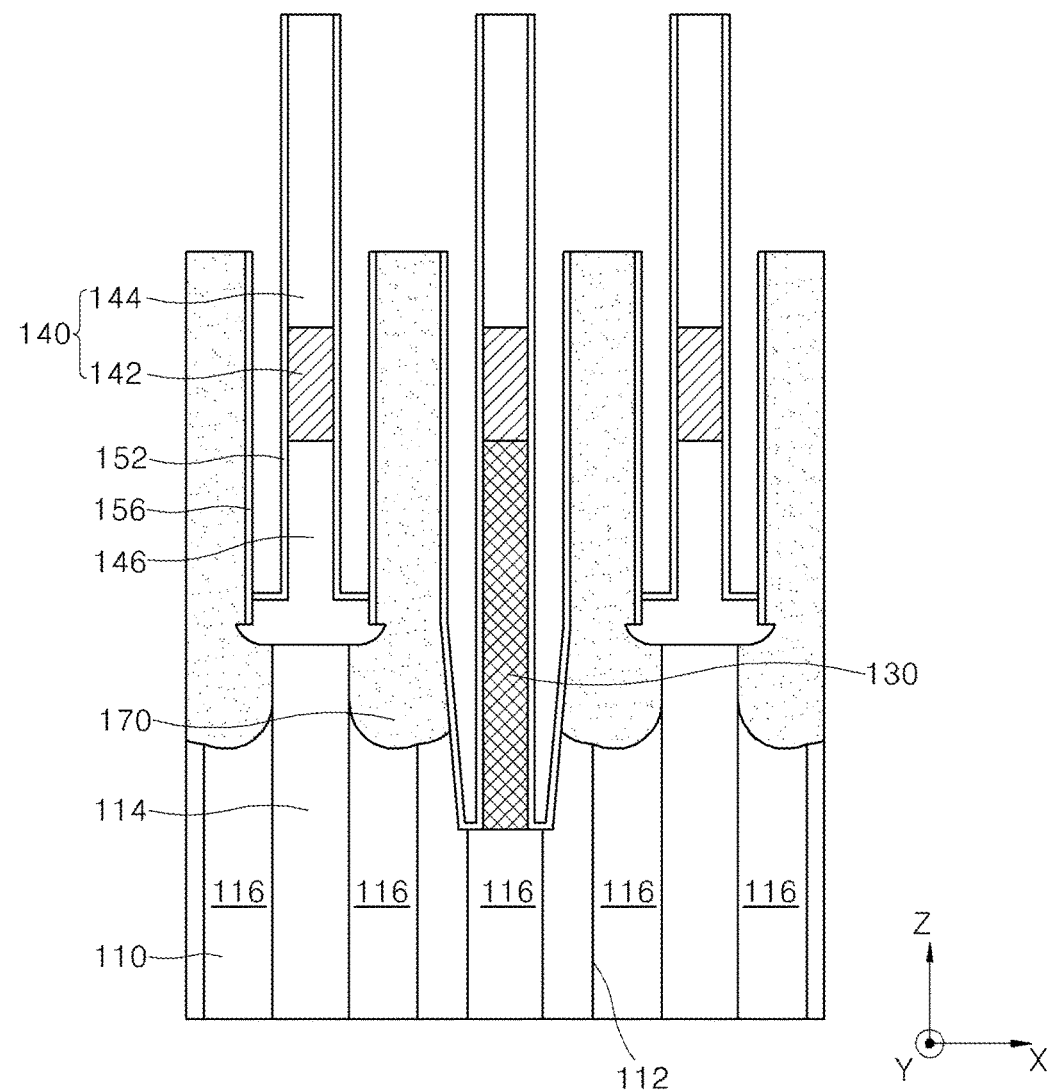

FIG. 13 is a cross-sectional view for describing a process of forming the second insulation spacer 154 of the insulation spacer structure 150 as an air spacer.

Referring to FIG. 13, in the semiconductor device of FIG. 9, the second insulation spacer 154 (see FIG. 12) is removed, and a space in which the second insulation spacer 154 was disposed is in an empty state. The second insulation spacer 154 may be formed of an insulating material, namely, at least one selected from among silicon oxide, silicon nitride, and a combination thereof, and an air spacer may be formed by using a material which selectively removes only the insulating material and has an etch selectivity. For example, the air spacer may be formed by selectively removing only the second insulation spacer 154 in the wet etching method using a cleaning solution containing an LAL solution or an SC-1 solution which selectively removes silicon oxide.

The air spacer may extend along a length direction of the plurality of conductive line structures 140. The air spacer may be formed between the plurality of conductive lines 142 and the plurality of contact plugs 170, in a limited space of a highly-scaled high-integration semiconductor device, and thus, a relative permittivity between the plurality of conductive lines 142 and the plurality of contact plugs 170 is reduced, thereby decreasing a capacitance between adjacent conductive lines.

Figure 14:
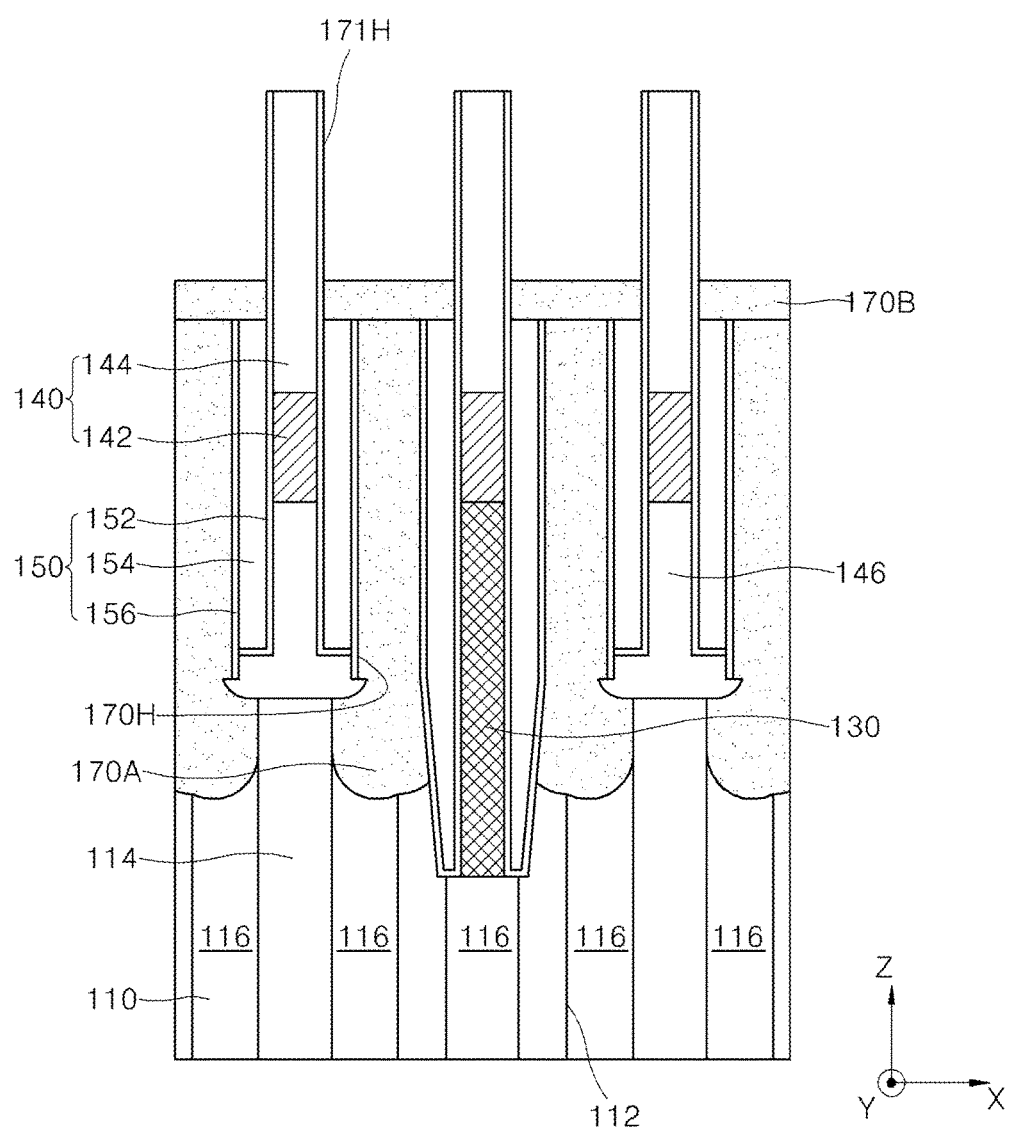

FIG. 14 is a view for describing a method of manufacturing the semiconductor device 102 of FIG. 6.

Referring to FIG. 14, in the manufacturing process described above with reference to FIG. 9, the contact conductive layer 170B is formed at a top of the contact plug 170A. The contact conductive layer 170B fills the second contact hole 171H limited by the first insulation spacer 152 which is formed at each of side walls of a pair of adjacent conductive line structures 140 among the plurality of conductive line structures 140, and is formed at a top of each of the contact plug 170A, second insulation spacer 154, and third insulation spacer 156.

The contact conductive layer 170B is formed to electrically and physically contact the contact plug 170A. The contact conductive layer 170B may be formed of the same material as that of the contact plug 170A. For example, the contact conductive layer 170B may be formed of poly silicon.

The contact conductive layer 170B may be formed by an etch back process, which selectively removes only poly silicon after poly silicon is deposited and has an etch selectivity, or a silicon selective epitaxial growth (Si-SEG) process which selectively grows only silicon. In example embodiments of the inventive concepts, the contact conductive layer 170B may be formed at a top of the contact plug 170A by using the Si-SEG process. The contact conductive layer 170B is formed to cover tops of the second and third insulation spacers 154 and 156, and thus, a broader width connected to the landing pad 172 (see FIG. 6) may be secured. Accordingly, a conductivity between the contact plug 170A and the landing pad 172 is enhanced, and a reliability of the semiconductor device is enhanced.

After the above-described process, by performing the process described above with reference to FIGS. 10 to 12, the semiconductor device 102 of FIG. 6 may be manufactured.

Figure 15:
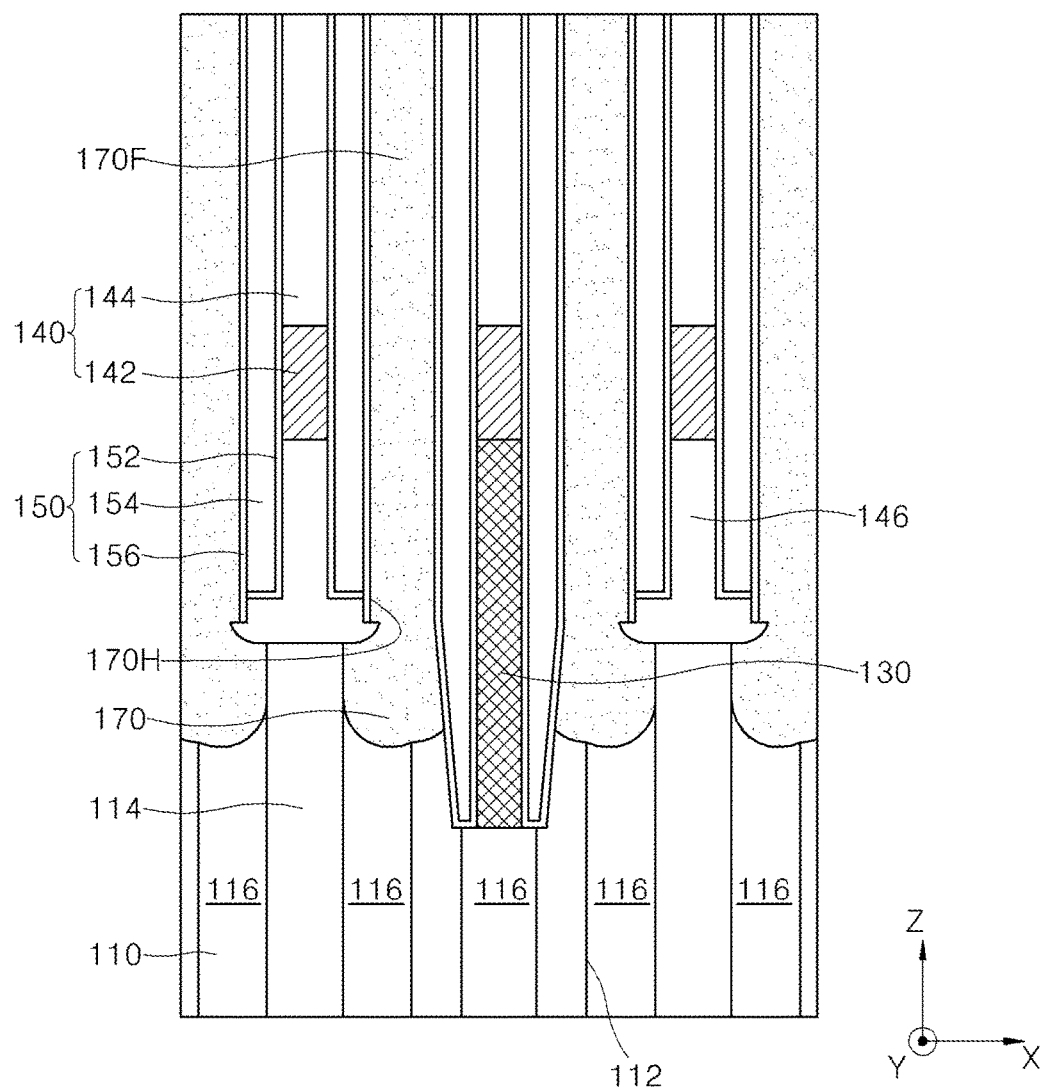
Figure 16:
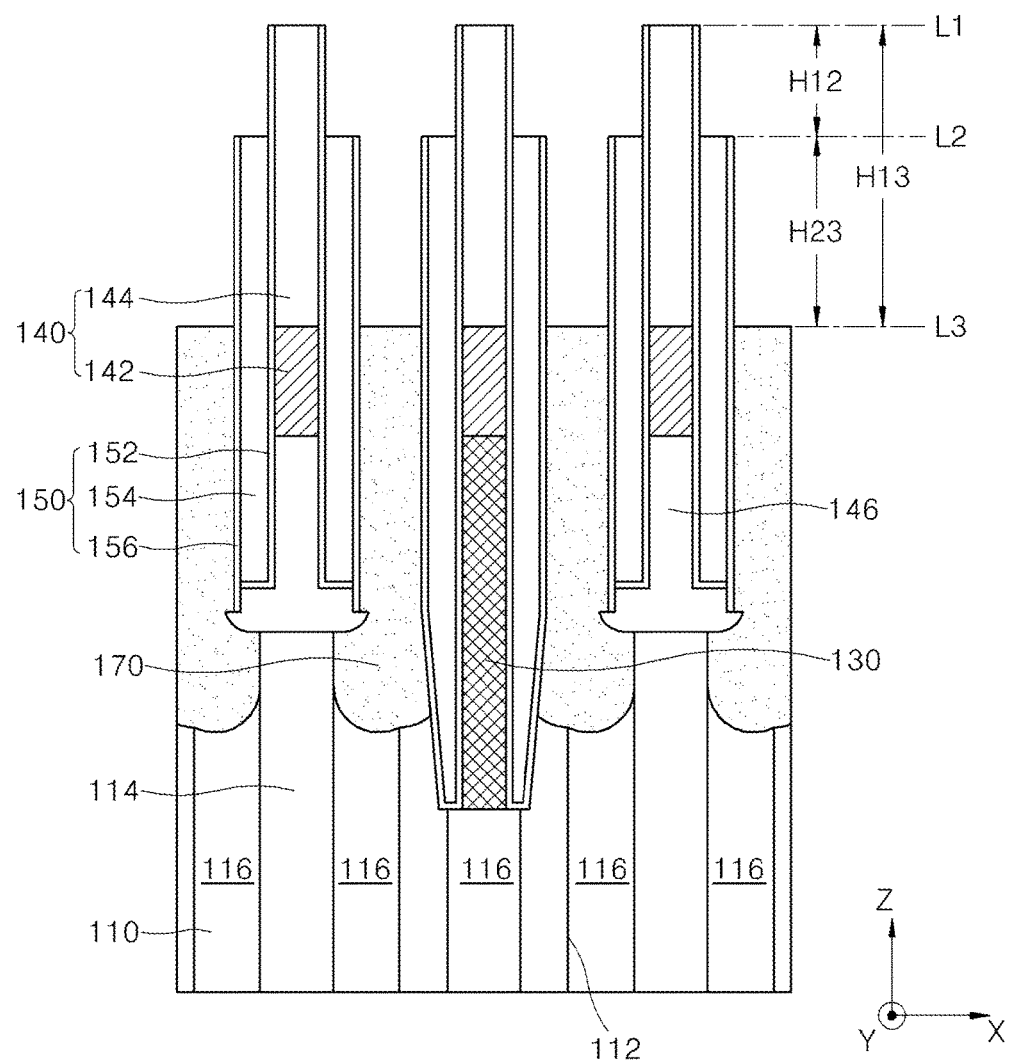
Figure 17:
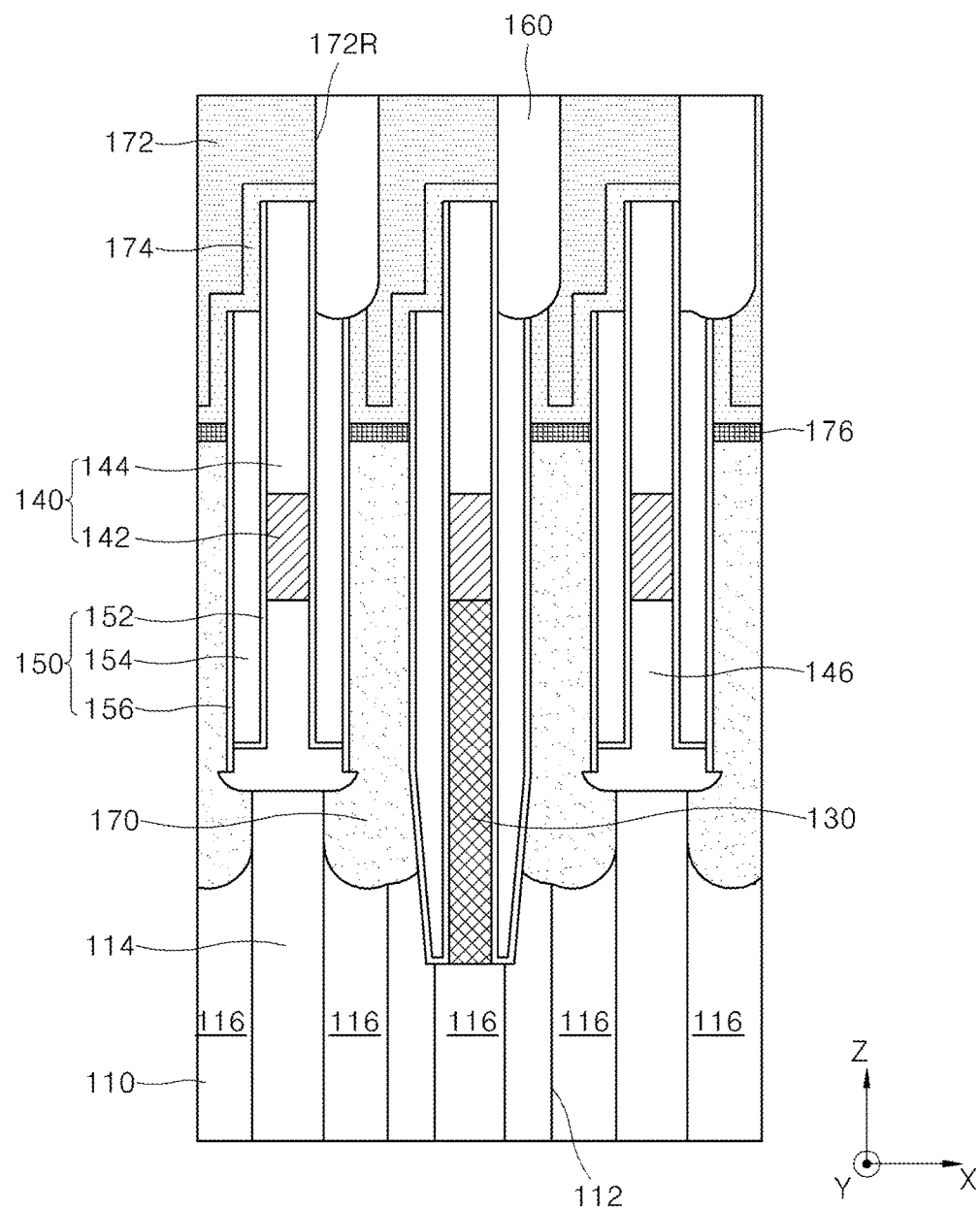

FIGS. 15 to 17 are cross-sectional views for describing a method of manufacturing the semiconductor device 104 of FIG. 7.

Referring to FIG. 15, the plurality of conductive line structures 140, the insulation spacer structure 150, and the contact plug forming conductive layer 170F are formed on the substrate 110. The description on the manufacturing process of FIG. 8 is applied to the plurality of conductive line structures 140 and the insulation spacer structure 150, and thus, the same descriptions are not repeated.

The contact hole 170H may be formed in a space limited by the insulation spacer structure 150 which is formed at each of side walls of a pair of adjacent conductive line structures 140 among the plurality of conductive line structures 140, and the contact plug forming conductive layer 170F may be by filling the contact hole 170H with a conductive material. A method of forming the contact plug forming conductive layer 170F may use one selected from among the chemical vapor deposition method, the physical vapor deposition method, and the silicon epitaxial growing method. A top level of the contact plug forming conductive layer 170F may be formed identically to those of the conductive line structures 140 and insulation spacer structure 150 in the above-described manufacturing process.

Referring to FIG. 16, the plurality of conductive line structures 140, the insulation spacer structure 150, and the contact plug 170 are formed to have different top levels. In detail, the plurality of conductive line structures 140 and the first insulation spacer 152 of the insulation spacer structure 150 are formed to have the same top level, namely, a first top level L1. Also, the second and third insulation spacers 154 and 156 of the insulation spacer structure 150 are formed to have the same top level, namely, a second top level L2. The contact plug 170 is formed to have a third top level L3. The first top level L1 may be formed higher than the second and third top levels L2 and L3, and the second top level L2 may be formed higher than the third top level L3. The first and second top levels L1 and L2 may form a first step height H12, and the second and third top levels L2 and L3 may form a second step height H23.

Upper portions of the second and third insulation spacers 154 and 156 are removed by the first step height H12 by using an etching method of selectively removing only the second and third insulation spacers 154 and 156, and then, an upper portion of the contact plug 170 is removed by the second step height H23 by using an etching method of selectively only the contact plug 170. The plurality of conductive line structures 140, the insulation spacer structure 150, and the contact plug 170 are formed to have different top levels by using the above-described method. However, a process sequence may be changed. That is, the plurality of conductive line structures 140, the insulation spacer structure 150, and the contact plug 170 are formed to have different top levels by using a process which is performed in a sequence where the upper portion of the contact plug 170 is removed by a third step height H13, and then, the upper portions of the second and third insulation spacers 154 and 156 are removed by the first step height H12.

Referring to FIG. 17, the conductive barrier layer 174 which covers the plurality of conductive line structure 140, the insulation spacer structure 150, and the contact plug 170 is formed, and the plurality of landing pads 172 and the landing pad insulation pattern 160 which separates the plurality of landing pads 172 are formed.

The conductive barrier layer 174 which covers tops of the plurality of conductive line structures 140, one side of the first insulation spacer 152, a portion of a top of the second insulation spacer 154, a side of the third insulation spacer 156, and a top of the contact plug 170 is formed. Except for a position at which the conductive barrier layer 174 is formed, a detailed description on the conductive barrier layer 174 is the same the description made above with reference to FIG. 10, and thus, the same description is not repeated.

A landing pad forming material layer is formed, the landing pad 172 is formed by forming the landing pad recess region 172R by using an etching mask, and the landing pad insulation pattern 160 is formed in the landing pad recess region 172R (see the description of FIG. 11). In the manufacturing method of FIG. 17, the first insulation spacer 152 is formed at each of both side walls of the insulation spacer structure 150. That is, the first insulation spacer 152 may remain without being etched in a process of forming the landing pad by using an etching process using the etching mask. As described above with reference to FIG. 16, the plurality of conductive line structures 140, the insulation spacer structure 150, and the contact plug 170 are formed to have different top levels, and thus, a space (limited by the first insulation spacer 152 which covers side walls of a pair of adjacent conductive line structures 140 among the plurality of conductive line structures 140) is relatively enlarged. Therefore, the landing pad recess region 172R is formed, and then, the first insulation spacer 152 is not exposed in the landing pad recess region 172R.

When the landing pad recess region 172R is formed and then the first insulation spacer 152 is not exposed in the landing pad recess region 172R, the conductive barrier layer 174 may remain without being removed because the conductive barrier layer 174 is formed at one side of the first insulation spacer 152. That is, the conductive barrier layer 174 may be disposed between the first insulation spacer 152 and the landing pad insulation pattern 160 which is formed to fill the landing pad recess region 172R. When the conductive barrier layer 174 is disposed between the landing pad insulation pattern 160 and the first insulation spacer 152, the bridge phenomenon in which the plurality of landing pads 172 are short-circuited without being separated occurs.

The bridge phenomenon is prevented or inhibited by additionally performing the process of removing the conductive barrier layer 174 which is disposed between the landing pad insulation pattern 160 and the first insulation spacer 152. The remaining conductive barrier layer 174 may be etched by using the wet etching method or the dry etching method which selectively removes only a conductive material.

Figure 18:
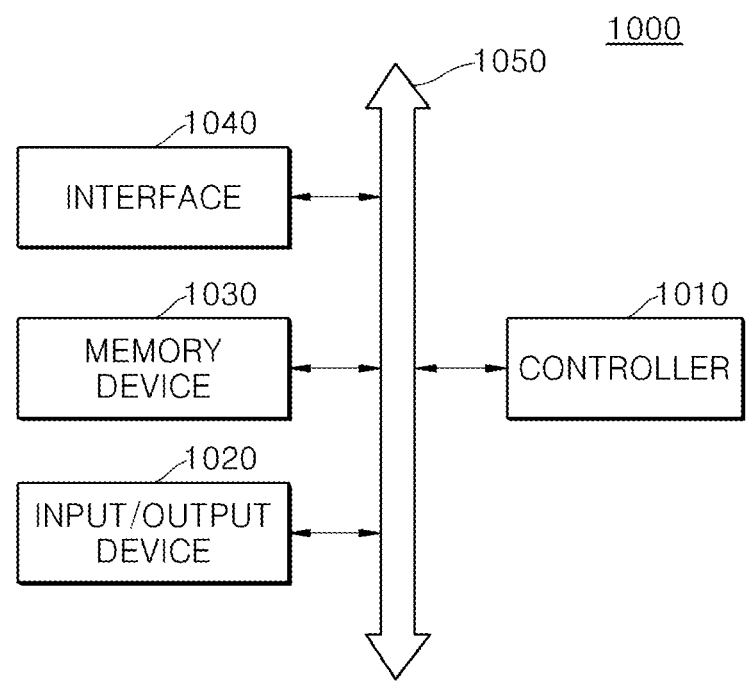
FIG. 18 is a block diagram of a system including a semiconductor device according to example embodiments of the inventive concepts.

FIG. 18 is a block diagram of a system 1000 including the semiconductor device 100 (102 and 104) according to example embodiments of the inventive concepts.

The system 1000 includes a controller 1010, an input/output unit 1020, a storage unit 1030, and an interface 1040. The system 1000 may be a mobile system or a system which transmits or receives information. In example embodiments, the mobile system includes a personal digital assistant (PDA), a portable computer, a web tablet, a wireless phone, a mobile phone, a digital music player, or a memory card. The controller 1010 controls an execution program in the system 1000, and may include a microprocessor, a digital signal processor, a microcontroller, or a device similar thereto. The input/output unit 1020 may be used to input or output data to or from the system 1000. The system 1000 may be connected to an external device (for example, a personal computer or a network) by using the input/output unit 1020, and may exchange data with the external device. The input/output unit 1020 may include, for example, a keypad, a keyboard, or a display.

The storage unit 1030 may store a code and/or data which are/is used for an operation of the controller 1010, or store data obtained through processing of the controller 1010. The storage unit 1030 includes a semiconductor device including a pin type field effect transistor according to example embodiments of the inventive concepts. For example, the storage unit 1030 may include the semiconductor device 100 (102 and 104) according to example embodiments of the inventive concepts.

The interface 1040 may be a data transmission path between the system 1000 and another external device. The controller 1010, the input/output unit 1020, the storage unit 1030, and the interface 1040 may communicate with each other through a bus 1050. The system 1000 may be applied to mobile phones, MP3 players, navigation, portable multimedia players (PMPs), solid state disks (SSDs), and household appliances.

Figure 19:
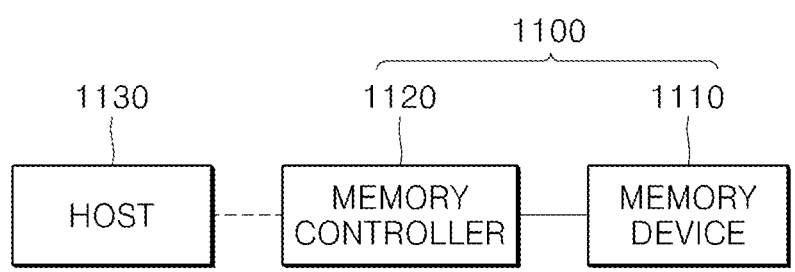
FIG. 19 is a block diagram of a memory card including a semiconductor device according to example embodiments of the inventive concepts.

FIG. 19 is a block diagram of a memory card 1100 including the semiconductor device 100 (102 and 104) according to example embodiments of the inventive concepts.

The memory card 1100 includes a storage unit 1110 and a memory controller 1120.

The storage unit 1110 may store data. In example embodiments, the storage unit 1110 may have nonvolatile characteristic in which stored data is maintained as-is even when power is cut off. The storage unit 1110 may include the semiconductor device 100 (102 and 104) according to example embodiments of the inventive concepts.

The memory controller 1120 may read data which is stored in the storage unit 1110, in response to a read/write request of a host 1130, or store data of the storage unit 1110. The memory controller 1120 may include the semiconductor device 100 (102 and 104) according to example embodiments of the inventive concepts.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
   a substrate including an active region;
   a plurality of conductive line structures separate from the substrate;
   a plurality of contact plugs between the plurality of conductive line structures, the plurality of contact plugs on a same horizontal level as the plurality of conductive line structures;
   a plurality of landing pads connected to a corresponding contact plug of the plurality of contact plugs;
   a landing pad insulation pattern between the plurality of landing pads; and
   a first insulation spacer between the landing pad insulation pattern and first conductive line structures from among the plurality of conductive line structures,
   wherein the plurality of landing pads vertically overlap the plurality of conductive line structures such that the plurality of landing pads cover upper portions of the plurality of conductive line structures, and
   the plurality of landing pads include first and second landing pads having widths of different sizes which cover an upper portion of a corresponding conductive line structure in a direction extending from a principal plane of the substrate.

2. The semiconductor device of claim 1, wherein second conductive line structures from among the plurality of conductive line structures are formed to directly contact the landing pad insulation pattern.

3. The semiconductor device of claim 1, wherein
   the first insulation spacer is included in an insulation spacer structure covering a side wall of each of the plurality of conductive line structures, and
   each of the plurality of contact plugs is formed in a space limited by the insulation spacer structure between adjacent conductive line structures of the plurality of conductive line structures.

4. The semiconductor device of claim 3, further comprising:
   a conductive barrier layer covering upper surfaces of the plurality of conductive line structures, an upper surface of each of the plurality of contact plugs, and a sidewall of the insulation spacer structure,
   wherein the conductive barrier layer is covered by the plurality of landing pads.

5. The semiconductor device of claim 3, wherein the insulation spacer structure includes an air spacer.

6. The semiconductor device of claim 3, wherein
   the insulation spacer structure includes the first insulation spacer, a second insulation spacer, and a third insulation spacer sequentially formed from a side wall of a corresponding conductive line structure, and
   the second and third insulation spacers and the plurality of contact plugs have an upper surface at a same level.

7. The semiconductor device of claim 6, wherein
   upper surfaces of the plurality of conductive line structures and an upper surface of the first insulation spacer are at a same level, and
   upper surfaces of the second insulation spacer and the third insulation spacer and upper surfaces of the plurality of contact plugs are lower than the upper surfaces of the plurality of conductive line structures and the upper surface the first insulation spacer.

8. The semiconductor device of claim 1, further comprising:
   a contact conductive layer contacting an upper surface of a corresponding contact plug.

9. The semiconductor device of claim 8, wherein
   the first insulation spacer is included in an insulation spacer structure covering a side wall of each of the plurality of conductive line structures, and
   the contact conductive layer covers a portion of an upper surface of the insulation spacer structure.

10. The semiconductor device of claim 8, wherein the plurality of contact plugs and the contact conductive layer are formed of the same material.

11. The semiconductor device of claim 8, wherein the contact conductive layer is a silicon epitaxial layer.

12. The semiconductor device of claim 1, further comprising:
a contact conductive layer contacting an upper surface of a corresponding contact plug,
wherein the plurality of contact plugs and the contact conductive layer are formed of the same material.

13. A semiconductor device comprising:
a substrate including an active region;
a plurality of conductive line structures separate from the substrate;
an insulation spacer structure covering a side wall of each of the plurality of conductive line structures;
a contact plug in a space limited by the insulation spacer structure between adjacent conductive line structures of the plurality of conductive line structures;
a conductive barrier layer covering upper surfaces of the plurality of conductive line structures, an upper surface of the contact plug, and a sidewall of the insulation spacer structure;
a plurality of landing pads connected to the contact plug through the conductive barrier layer; and
a landing pad insulation pattern between the plurality of landing pads, the landing pad insulation pattern covering a portion of an upper surface of each of the plurality of conductive line structures and a portion of an upper surface of the insulation spacer structure,
wherein the insulation spacer structure includes a first insulation spacer between the landing pad insulation pattern and the plurality of conductive line structures.

14. The semiconductor device of claim 13, wherein
the insulation spacer structure further includes second and third insulation spacers,
the plurality of conductive line structures and the first insulation spacer have upper surfaces at a first level,
the second and third insulation spacers have upper surfaces at a second level,
the contact plug has an upper surface at a third level,
the first level is higher than the second and third levels, and
the second level is higher than the third level.

15. The semiconductor device of claim 14, wherein the second insulation spacer is an air spacer.

16. A semiconductor device comprising:
a substrate including an active region;
a plurality of conductive line structures separate from the substrate;
an insulation spacer structure covering a side wall of each of the plurality of conductive line structures, the insulation spacer structure having a first portion with an upper surface higher than a second portion;
a plurality of contact plugs between the plurality of conductive line structures, the plurality of contact plugs connected to the active region and having a first width; and
a plurality of landing pads connected to a corresponding contact plug of the plurality of contact plugs, the plurality of landing pads including a lower region having a second width greater than the first width.

17. The semiconductor device of claim 16, wherein the plurality of landing pads include an upper region having a third width less than the second width.

18. The semiconductor device of claim 16, further comprising:
a conductive barrier layer covering upper surfaces of the plurality of conductive line structures, an upper surface of each of the plurality of contact plugs, and a sidewall of the insulation spacer structure,
wherein the conductive barrier layer is covered by the plurality of landing pads.

19. The semiconductor device of claim 16, wherein
the second portion of the insulation spacer structure includes an air spacer,
the second portion of the insulation spacer structure and the plurality of contact plugs have an upper surface at a same level, and
the first portion of the insulation spacer structure and the plurality of conductive line structures have an upper surface at a same level.

* * * * *